(12) United States Patent
Hirai

(10) Patent No.: US 7,138,304 B2
(45) Date of Patent: Nov. 21, 2006

(54) METHOD FOR FORMING THIN FILM PATTERN, DEVICE AND PRODUCTION METHOD THEREFOR, ELECTRO-OPTICAL APPARATUS AND ELECTRONIC APPARATUS, AND PRODUCTION METHOD FOR ACTIVE MATRIX SUBSTRATE

(75) Inventor: Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/842,563

(22) Filed: May 11, 2004

(65) Prior Publication Data

US 2005/0005799 A1     Jan. 13, 2005

(30) Foreign Application Priority Data

| May 16, 2003 | (JP) | ............................ 2003-139190 |
| May 29, 2003 | (JP) | ............................ 2003-153201 |
| Apr. 6, 2004 | (JP) | ............................ 2004-112062 |

(51) Int. Cl.
*H01L 21/84* (2006.01)

(52) U.S. Cl. ........................ 438/149; 438/641; 438/675

(58) Field of Classification Search ........ 438/149–166, 438/378, 584–688, 795–799
See application file for complete search history.

(56) References Cited

U.S. PATENT DOCUMENTS

| 5,807,437 | A | * | 9/1998 | Sachs et al. ................ 118/688 |
| 6,017,259 | A |   | 1/2000 | Motoi et al. |
| 6,060,113 | A | * | 5/2000 | Banno et al. .................. 427/78 |
| 6,531,392 | B1 |  | 3/2003 | Song et al. |
| 6,613,399 | B1 | * | 9/2003 | Miyamoto et al. .......... 427/558 |
| 6,761,925 | B1 |  | 7/2004 | Banno et al. |
| 6,810,814 | B1 | * | 11/2004 | Hasei ......................... 101/485 |
| 6,827,619 | B1 | * | 12/2004 | Oda et al. ...................... 445/6 |
| 2004/0201048 | A1 |  | 10/2004 | Seki et al. |
| 2004/0234690 | A1 | * | 11/2004 | Hiruma ...................... 427/256 |
| 2005/0003645 | A1 |   | 1/2005 | Hirai |
| 2005/0007398 | A1 | * | 1/2005 | Hirai ............................. 347/1 |
| 2005/0064633 | A1 | * | 3/2005 | Mikoshiba .................. 438/151 |
| 2005/0170076 | A1 |   | 8/2005 | Seki et al. |
| 2005/0170550 | A1 |   | 8/2005 | Seki et al. |
| 2005/0186403 | A1 |   | 8/2005 | Seki et al. |
| 2005/0191781 | A1 | * | 9/2005 | Hirai ........................... 438/30 |

FOREIGN PATENT DOCUMENTS

| CN | 1045895 A | 10/1990 |
| CN | 1257304 A | 6/2000 |
| CN | 1258428 A | 6/2000 |
| EP | 0 417 294 A1 | 3/1991 |
| EP | 0 989 778 A1 | 3/2000 |
| EP | 0989778 | * 3/2000 |
| JP | 05-220887 | 8/1993 |
| JP | A 9-203803 | 8/1997 |
| JP | A 9-230129 | 9/1997 |
| JP | 11-204529 | 7/1999 |
| JP | 11-207959 | 8/1999 |
| JP | A 11-274671 | 10/1999 |

(Continued)

*Primary Examiner*—Savitri Mulpuri
(74) *Attorney, Agent, or Firm*—Oliff & Berridge, PLC

(57) ABSTRACT

A method for forming a thin film pattern includes the step of ejecting a plurality of liquid droplets of a function liquid at predetermined pitches between banks, wherein each of the predetermined pitches is larger than a diameter of the liquid droplet and the predetermined pitches are set so that adjacent liquid droplets coalesce with each other when wetting and spreading within a groove formed between the banks.

8 Claims, 15 Drawing Sheets

FOREIGN PATENT DOCUMENTS

| | | |
|---|---|---|
| JP | A 2000-216330 | 8/2000 |
| JP | 2000-353594 | 12/2000 |
| JP | 2003-080694 | 3/2003 |
| JP | 2003-133691 | 5/2003 |
| WO | WO 99/48339 | 9/1999 |
| WO | WO 02/073712 A1 | 9/2002 |

* cited by examiner

METHOD FOR FORMING THIN FILM PATTERN, DEVICE AND PRODUCTION METHOD THEREFOR, ELECTRO-OPTICAL APPARATUS AND ELECTRONIC APPARATUS, AND PRODUCTION METHOD FOR ACTIVE MATRIX SUBSTRATE

BACKGROUND OF THE INVENTION

1. Field of the Invention

The present invention relates to a method for forming a thin film pattern, to a device and a production method therefore, to an electro-optical apparatus and electronic apparatus, and to a production method for an active matrix substrate.

Priority is claimed on Japanese Patent Application No. 2003-139190, filed May 16, 2003, Japanese Patent Application No. 2003-153201, filed May 29, 2003, and Japanese Patent Application No. 2004-112062, filed Apr. 6, 2004, the contents of which are incorporated herein by reference.

2. Description of the Related Art

Up to now, as a production method for fine wiring patterns of a semiconductor integrated circuit and the like, a photolithography method is frequently used. On the other hand, Japanese Unexamined Patent Application, First Publication No. Hei 11-274671 and Japanese Unexamined Patent Application, First Publication No. 2000-216330 disclose methods of using liquid droplet ejecting systems. The technology currently disclosed in these documents disposes (applies) a material on a pattern formation surface by ejecting a function liquid, containing a pattern forming material, on a substrate from a liquid droplet ejecting head, to form a wiring pattern. Hence, it is said that this is very effective since this technology is applicable to multi-product and small scale production system.

The high densification of circuits constituting devices in recent years is increasingly advancing, and further miniaturization and thinning is demanded also for, for example, wiring patterns.

However, when it is intended to form such a fine wiring pattern by a method according to the above-mentioned liquid droplet ejecting systems, it is especially difficult to fully achieve the accuracy of the wiring width. Japanese Unexamined Patent Application, First Publication No. Hei 09-203803 and Japanese Unexamined Patent Application, First Publication No. Hei 09-230129 disclose techniques of providing on a substrate banks which are partition members, and performing surface finishing so that upper portions of the banks may become liquid-repellent and the other portions may be made to have liquid-affinity.

By using this technology, even if a line is thin, it is possible to form a thin line by regulating the width of a wiring pattern with the width between the banks.

On the other hand, since the banks are formed by using a photolithography method, there is a possibility of cost increase. Hence, it is also proposed to selectively eject a liquid material (function liquid) on liquid-affinity sections of the substrate where liquid-repellent sections and the liquid-affinity sections are patterned beforehand by a liquid droplet ejecting system. In this case, since a liquid material where, for example, conductive fine particles are dispersed tends to collect on the liquid-affinity sections, it is possible to form a wiring pattern while maintaining positional accuracy without forming the banks.

Nevertheless, the following problems exist in the prior art mentioned above.

When the width of a groove formed between banks is reduced so as to perform thinning, each diameter of ejected liquid droplets may become larger than the width of the groove. In this case, there is a possibility that liquid droplets reaching targets may overflow on the surfaces of the banks and may remain, and there is a possibility of a short circuit when a liquid droplet remains on a bank between adjacent wirings, which greatly reduces the quality of a device.

On the other hand, if the substrate where liquid-repellent sections and liquid-affinity sections are patterned is used, each diameter of liquid droplets ejected may become larger than each width of the liquid-affinity sections when the width of each liquid-affinity section is reduced so as to perform thinning. Also in this case, a liquid droplet reaching a target overflows on the surface of the liquid-repellent section and remains, and there is a possibility of short circuiting.

The present invention is created in consideration of the above points, and aims to provide a method for forming a thin film pattern which can form wiring without allowing a liquid droplet to remain on a bank, a device and a production method therefor, an electro-optical apparatus and an electronic apparatus, and a production method for an active matrix substrate.

In addition, the present invention aims to provide a method for forming a thin film pattern which can form wiring without allowing a liquid droplet to remain on a liquid-repellent section, a device and a production method therefor, an electro-optical apparatus and an electronic apparatus, and a production method for an active matrix substrate.

SUMMARY OF THE INVENTION

The present invention provides the following methods in order to attain the above-described objects.

A method for forming a thin film pattern according to the present invention including the step of ejecting a plurality of liquid droplets of a function liquid at predetermined pitches between banks, wherein each of the predetermined pitches is larger than a diameter of the liquid droplet and the predetermined pitches are set so that adjacent liquid droplets coalesce with each other when wetting and spreading within a groove formed between the banks.

Therefore, according to the method for forming a thin film pattern according to the present invention, it is possible to draw liquid droplets, overflowing on a bank surface, into a groove since the liquid droplets in a contact area pull against each other when the liquid droplets adjacently ejected connect with each other even in the state that some of the ejected liquid droplets overflow and remain on the bank surfaces. Therefore, since liquid droplets do not remain on the bank, it is possible to prevent degradation by short circuiting, etc.

As a liquid droplet ejection pitch, in order to enlarge the drawing force of a liquid droplet on a bank, it is preferable to make the liquid droplet in a size such that the liquid droplet connects with an adjacent liquid droplet when the liquid droplet wets and spreads in a groove.

In addition, it is preferable that the width of the above-mentioned groove be smaller than each diameter of the above-mentioned liquid droplets so as to attain thinning. In this case, even if a part of a ejected liquid droplet remains on the bank, it becomes possible to make the function liquid enter into the groove between banks according to the fluidity, a capillary phenomenon, etc., of the function liquid. Hence, it is possible to obtain a thin line pattern controlled by the width between banks.

Furthermore, it is preferable to impart the bank a liquid-repellency higher than that of the groove. In this case, even if a part of an ejected liquid droplet gets on the bank, the bank surface is liquid-repellent. Hence, it is repelled from the bank and easily flows into the groove between the banks.

In addition, the method for forming a thin film pattern according to the present invention is a method for forming a thin film pattern by ejecting a plurality of liquid droplets of a function liquid at predetermined pitches in an application region between liquid-repellent areas formed with liquid-repellent films, and is characterized in that the liquid droplets are ejected at pitches, each of which is larger than the diameter of the liquid droplet, and enables adjacent liquid droplets to contact within the application region.

Therefore, according to the method for forming a thin film pattern according to the present invention, it is possible to draw liquid droplets, overflowing in the liquid repellent area, into the application region since the liquid droplets in the contact areas pull against each other when the liquid droplets adjacently ejected connect with each other even in the state in which some of the ejected liquid droplets overflow and remain in the liquid repellent areas. Therefore, since a liquid droplet does not remain in the liquid repellent area, it is possible to prevent degradation by a short circuit etc.

As a liquid droplet ejection pitch, in order to increase the drawing force of a liquid droplet on a liquid repellent area, it is preferable to make the liquid droplet in a size such that the liquid droplet connects with the above-mentioned adjacent liquid droplet when the liquid droplet wets and spreads in the above-mentioned application region.

In addition, it is preferable that the width of the above-mentioned application region be smaller than the diameter of the above-mentioned liquid droplet so as to attain thinning. In this case, even if a part of an ejected liquid droplet remains on the liquid-repellent area, it becomes possible to make the function liquid enter into the application region according to the fluidity, liquid-repellency, etc. of the function liquid. Hence, it is possible to obtain a thin line pattern controlled by the width of the application region.

In particular, it is preferable to give a liquid repellent area liquid-repellency higher than that of the above-mentioned application region so as to repel function liquid and to enter it the application region effectively.

In the present invention, it is possible to preferably adopt the structure that a liquid-repellent monomolecular film is formed on the surface as the above-mentioned liquid-repellent film. It is preferable to use a self-organizing film made of organic molecules as the liquid-repellent monomolecular film. In that case, it is possible to form a monomolecular film easily.

In addition, it is preferable to impart liquid-affinity to an application area. In this case, it is possible to preferably adopt the irradiation of ultraviolet light, plasma processing where oxygen is used as a reactive gas, or the processing of exposing a substrate to an ozone ambient atmosphere. In this case, since it is possible to uniformly break a liquid-repellent film, which is once formed, partially and on the whole, it is possible to reduce liquid-repellency, and to obtain desired liquid-affinity uniformly.

Furthermore, when function liquid contains conductive fine particles, an organic silver compound, etc., it is possible to use a thin film pattern as a wiring pattern, and hence, this can be applied to various devices. In addition, it is possible to use as a function liquid one which contains a material which exhibits electrical conductivity by heat treatment such as heating, or optical processing such as optical irradiation. In addition, this is applicable also to the production of an organic electroluminescent apparatus, a liquid crystal display which has a light filter, and the like by using formation materials of a light emitting element such as organic electroluminescence, and R-G-B ink materials instead of the conductive fine particles.

On the other hand, a device production method according to the present invention is a production method of a device which is constituted by forming a thin film pattern on a substrate, and is characterized in that the above-mentioned thin film pattern is formed on the above-mentioned substrate by the above-described method for forming a thin film pattern.

In addition, a device according to the present invention is a device which is constituted by forming a thin film pattern on a substrate, and is characterized in that the above-mentioned thin film pattern is formed on the above-mentioned substrate by the above-described method for forming a thin film pattern.

Thereby, the present invention makes it possible to obtain a thin device in which a thin film pattern of thin lines is formed without degradation such as a short circuit.

Then, an electro-optical apparatus according to the present invention is characterized by comprising the above-described device.

In addition, an electronic apparatus according to the present invention is characterized by comprising the above-described electro-optical apparatus.

Thereby, the present invention makes it possible to obtain a thin electro-optical apparatus and thin electronic apparatus without degradation such as a short circuit.

Furthermore, a production method of an active matrix substrate according to the present invention includes a first step of forming a gate wire on a substrate, a second step of forming a gate insulating film on the gate wiring, a third step of stacking a semiconductor layer via the gate insulating film, a fourth step of forming a source electrode and a drain electrode on the gate insulating layer, a fifth step of disposing insulating material on the source electrode and the drain electrode, and a sixth step of forming a pixel electrode on the disposed insulating material, wherein the method for forming a thin film pattern is used at at least one step of the first step, the fourth step, and the sixth step.

According to the present invention, it becomes possible to obtain a thin active matrix substrate in which a thin film pattern of thin lines is formed without degradation such as a short circuit arising in the gate wiring, source electrode and drain electrode, and pixel electrode.

DETAILED DESCRIPTION OF THE PREFERRED EMBODIMENTS

Figure 1:
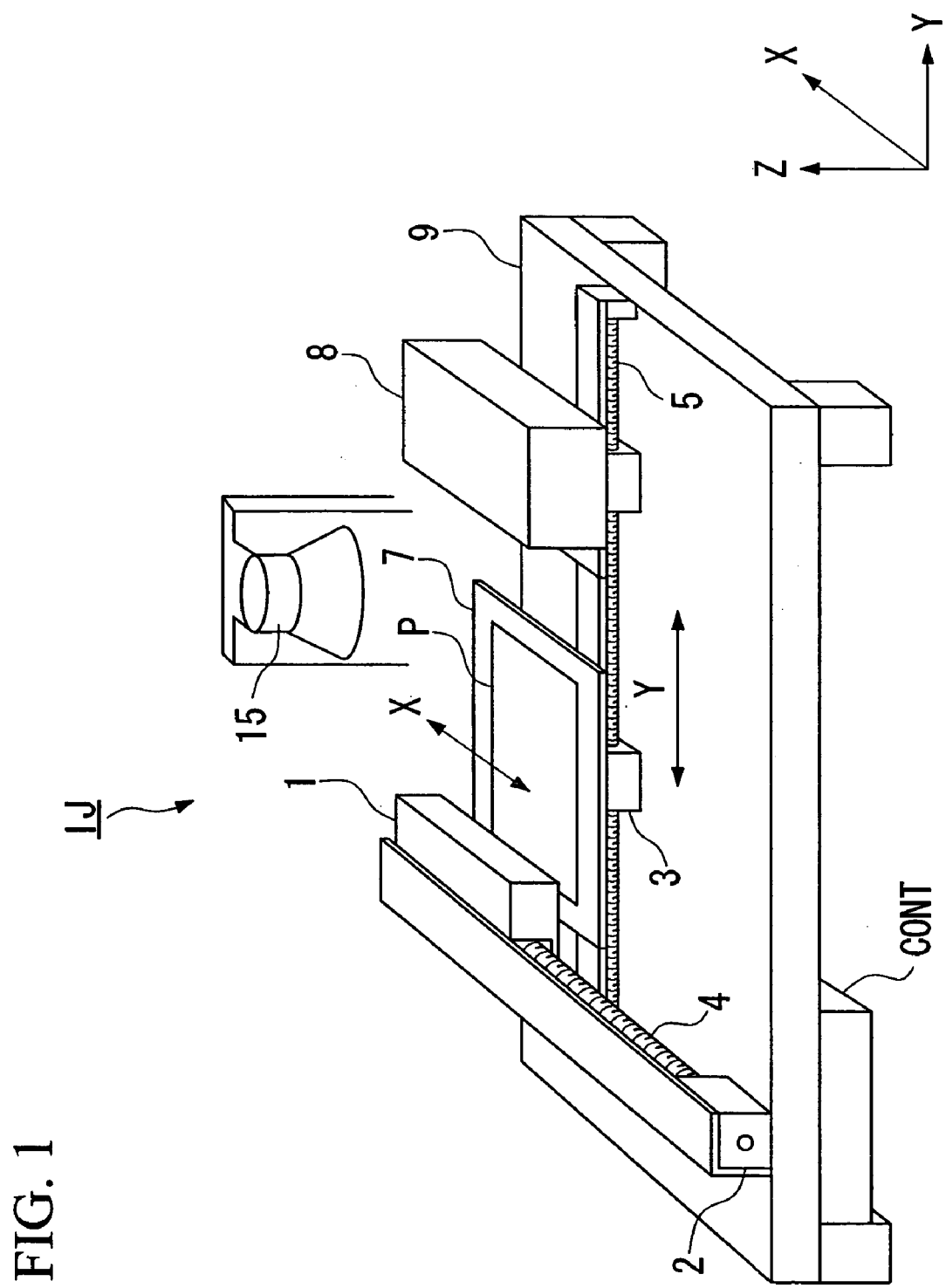
FIG. 1 is a schematic perspective view of a liquid droplet ejecting apparatus.

Hereafter, embodiments of a method for forming a thin film pattern, a device and its production method, an electro-optical apparatus and an electronic apparatus, and a production method of an active matrix substrate will be explained with reference to FIGS. 1 to 19C.

(First Embodiment)

In this embodiment, a case will be explained, in which a wiring pattern formed with a conductive film is formed on the substrate, the wiring pattern which is formed by ejecting ink (function liquid) for wiring patterns (thin film pattern) which contains conductive fine particles is ejected from a nozzle of a liquid ejecting head in the shape of a liquid droplet by a liquid droplet ejecting method.

This ink for wiring patterns includes dispersion liquid, where conductive fine particles are dispersed in a dispersion medium, and a solution where an organic silver compound or silver oxide nano particles are dispersed in a solvent (dispersion medium).

In this embodiment, fine metal particles containing any one of, for example, gold, silver, copper, palladium, or nickel, oxides of these, and conductive polymers or fine particles of superconductor, etc., are used as the conductive fine particles.

It is also possible to use these conductive fine particles after coating them with organic substances, etc., on their surfaces, in order to enhance dispersibility.

It is preferable that the particle diameter of the conductive fine particles be not less than 1 nm and not larger than 0.1 μm. If it is larger than 0.1 μm, there is a possibility that clogging may occur in a nozzle of a liquid ejecting head described below. In addition, if it is smaller than 1 nm, a volume ratio of a coating agent to the conductive fine particles becomes large, and hence, a ratio of an organic substance in the film obtained becomes excessive.

The dispersion medium is not limited especially so long as it can disperse the above-described electroconductive fine particles and does not cause cohesion. For example, substances which can exemplify this are, besides water, alcohols such as methanol, ethanol, propanol, and butanol; hydrocarbon group compounds such as n-heptane, n-octane, decane, dodecane, tetra-decane, toluene, xylene, cymene, duren, indene, dipentene, tetrahydronaphthalene, decahydronaphthalene, and cyclohexylbenzene; ether group compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis (2-methoxy ethyl) ether, and p-dioxane, and further, polar compounds such as propylene carbonate, gamma-butyrolactone, N-methyl-2-pyrrolidone, dimethylformamide, dimethyl sulfoxide, and cyclohexanone. Among these, in respect of the dispersibility of fine particles, the stability of dispersion liquid, and the ease of application to the liquid droplet ejecting method (ink jet method), it is possible to preferably cite water; an alcohol, a hydrocarbon group compound, and an ether group compound; and to cite the water, and hydrocarbon group compound as a more preferable dispersion medium.

It is preferable that the surface tension of a dispersion liquid of the above-mentioned conductive fine particles be a range of 0.02 to 0.07 N/m. If surface tension is less than 0.02 N/m when liquid is ejected using the ink jet method, wettability of ink compositions on a nozzle face increases, and hence, it becomes easy to cause an irrelevant ejection. On the other hand, since a shape of a meniscus in a nozzle tip is not stabilized if the surface tension exceeds 0.07 N/m, it becomes difficult to control an ejection and ejecting timing. A small amount of surface tension modifier such as a fluorine group (type), silicone group, or nonion group modifier in a range in which a contact angle with a substrate is not greatly reduced, may be added in the above-mentioned dispersion liquid so as to adjust the surface tension. The nonion group surface tension modifier enhances the wettability of liquid on a substrate, improves the leveling property of a film, and is useful for prevention of generation of fine irregularities of the film etc. The above-mentioned surface tension modifier may also include organic compounds such as alcohol, ether, ester, and ketone, if necessary.

It is preferable that the viscosity of the above-mentioned dispersion liquid be not less than 1 mPa·s and not more than 50 mPa·s. If the viscosity is less than 1 mPa·s when a liquid material is ejected as a liquid droplet by using the ink jet method, a part around a nozzle tends to be polluted by the spillover of ink. In addition, if the viscosity is larger than 50 mPa·s, a clogging frequency in a nozzle hole becomes high, and hence, it becomes difficult to smoothly eject a liquid droplet.

As a substrate on which a wiring pattern is formed, it is possible to use various kinds of materials such as glass, quartz glass, a Si wafer, a plastic film, and a metal plate. In addition, the materials also include these various kinds of material substrates where semiconductor films, metal films, dielectric films, organic films, etc. are formed on their surfaces as base layers, respectively.

Here, what are cited as ejection technologies of a liquid droplet ejecting method are a charging control system, a pressurized vibration system, an electromechanical transformation system, an electrothermal transformation system, an electrostatic attraction system, etc. The charging control system imparts electrical charges to a material with a charging electrode, controls an ejecting direction of the material by a deflecting electrode, and makes the material ejected from a nozzle. In addition, the pressurizing vibration system applies about 30 kg/cm$^2$ of super high pressure to a material to make the material be ejected toward a nozzle tip. When a control voltage is not applied, the material goes straight on to be ejected from the nozzle, and when the control voltage is applied, electrostatic repulsion between materials occurs, and materials disperse to be not ejected from the nozzle. In addition, the electromechanical transformation system uses the property that a piezoelectric element deforms in response to a pulsed electrical signal. When the piezoelectric element deforms, pressure is exerted via a flexible substance to a space which stores a material, and the material is expelled from this space to be ejected from the nozzle.

In addition, the electrothermal transformation system produces a bubble generated by rapidly evaporating a material with a heater provided in a space which stores the material, and makes the material in the space ejected by the pressure of the bubble. An electrostatic attraction system applies minute pressure to a space which stores a material, forms a meniscus of the material in a nozzle, and draws out the material after applying electrostatic attraction in this state. Furthermore, in addition to these, it is also possible to apply technologies such as a system of using a viscosity change of fluid by an electric field, and a system of ejecting a material by a discharge spark. The liquid droplet ejecting method has advantages that the use of the material has little waste, and moreover, a desired amount of material can be exactly disposed at a desired position. In addition, one drop of an amount of the liquid material (fluid) ejected by a liquid droplet ejecting method weighs, for example, 1 to 300 ng.

Next, a device production apparatus for a device of the present invention will be explained.

A liquid droplet ejecting apparatus (ink jet apparatus) which produces a device by ejecting a liquid droplet from a liquid droplet ejecting head to a substrate is used as this device production apparatus.

FIG. 1 is a perspective view showing the schematic construction of a liquid droplet ejecting apparatus IJ.

The liquid droplet ejecting apparatus IJ includes a liquid droplet ejecting head 1, an X-axis direction drive shaft 4, a Y-axis direction guide shaft 5, a controller CONT, a stage 7, a cleaning mechanism 8, a base 9, and a heater 15.

The stage 7 supports a substrate P on which ink (a liquid material, function liquid) is ejected by this liquid droplet ejecting apparatus IJ, and includes a clamping mechanism, which is not shown, that fixes the substrate P to a reference position.

The liquid droplet ejecting head 1 is a multi-nozzle type liquid droplet ejecting head having a plurality of ejecting nozzles, and its longitudinal direction coincides with the X-axis direction. Each of a plurality of ejecting nozzles is provided in the bottom face of the liquid droplet ejecting head 1 at regular intervals along the Y-axis direction. From the ejecting nozzle of the liquid droplet ejecting head 1, ink containing the above-mentioned conductive fine particles is ejected to the substrate P supported by the stage 7.

The X-axis direction drive motor 2 is connected to the X-axis direction drive shaft 4. The X-axis direction drive motor 2 is a stepping motor, etc., and when an X-axis direction drive signal is supplied from the controller CONT, it rotates the X-axis direction drive shaft 4. When the X-axis direction drive shaft 4 is rotated, the liquid droplet ejecting head 1 moves in the X-axis direction.

The Y-axis direction guide shaft 5 is fixed so that it cannot move with reference to the base 9. The stage 7 includes a Y-axis direction drive motor 3. The Y-axis direction drive motor 3 is a stepping motor, etc., and when a Y-axis direction drive signal is supplied from the controller CONT, it moves the stage 7 in the Y-axis direction.

The controller CONT supplies a voltage for the control of ejecting liquid droplets to the liquid droplet ejecting head 1. In addition, the controller CONT supplies a drive pulse signal controlling the movement of the liquid droplet ejecting head 1 in the X-axis direction to the X-axis direction drive motor 2, and supplies a drive pulse signal controlling the movement of the stage 7 in the Y-axis direction to the Y-axis direction drive motor 3.

The cleaning mechanism 8 cleans the liquid droplet ejecting head 1. The cleaning mechanism 8 is provided with a Y-axis direction drive motor, which is not shown. By the drive of this drive motor in the Y-axis direction, the cleaning mechanism moves along the Y-axis direction guide shaft 5. The movement of the cleaning mechanism 8 is also controlled by the controller CONT.

The heater 15 is a means for heat treatment of the substrate P by lamp annealing, and evaporates and dries a solvent contained in a liquid material applied on the substrate P. The power-on and power-off of this heater 15 are also controlled by the controller CONT.

The liquid droplet ejecting apparatus IJ ejects a liquid droplet to the substrate P while scanning relatively the liquid droplet ejecting head 1 and stage 7 supporting the substrate P. Here, let the X-axis direction be a scanning direction, and let the Y-axis direction, which is orthogonal to the X-axis direction, be a non-scanning direction, in the following explanation. Therefore, the ejecting nozzles of the liquid droplet ejecting head 1 are provided while being arranged in regular intervals in the Y-axis direction which is the non-scanning direction. In addition, although the liquid droplet ejecting head 1 is disposed orthogonally to the traveling direction of the substrate P in FIG. 1, the head 1 may be made to be intersected to the traveling direction of the substrate P by adjusting an angle of the liquid droplet ejecting head 1. Thereby, it is possible to adjust pitches between nozzles by adjusting the angle of the liquid droplet ejecting head 1. In addition, the distance between the substrate P and a nozzle face arbitrarily may be able to be adjusted.

Figure 2:
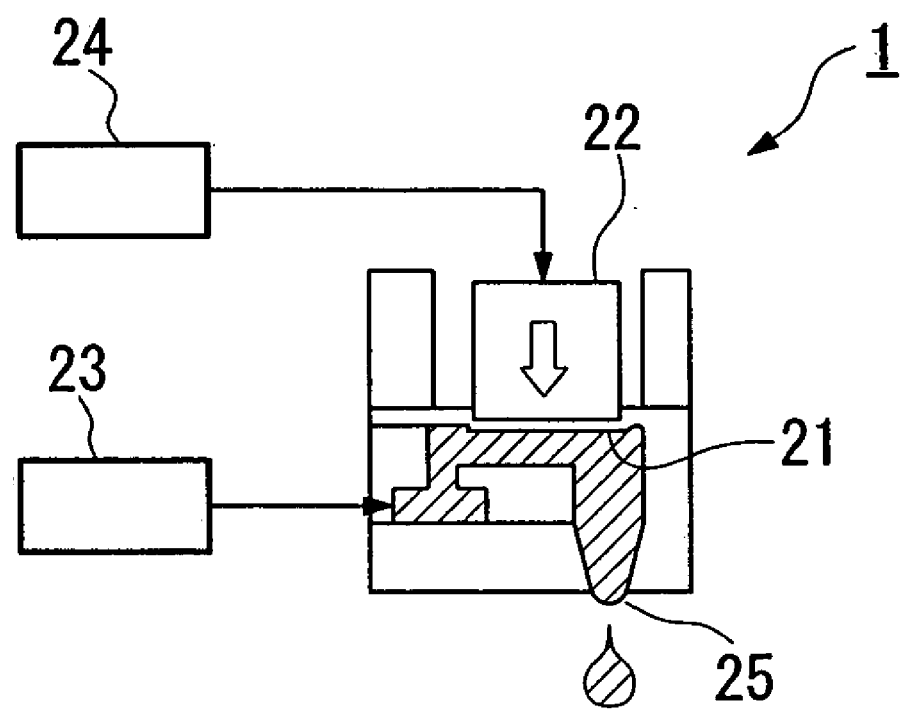
FIG. 2 is a diagram for explaining an ejecting principle of a liquid material by a piezoelectric system.

FIG. 2 is a diagram for explaining a discharge principle of a liquid material by a piezoelectric system.

In FIG. 2, a piezoelectric element 22 is installed adjacent to a liquid chamber 21 containing a liquid material (ink for wiring patterns, function liquid). The liquid material is supplied to the liquid chamber 21 via a liquid material supply system 23 including a material tank containing the liquid material. The piezoelectric element 22 is connected to a drive circuit 24. By applying a voltage to the piezoelectric element 22 via this drive circuit 24 to deform the piezoelectric element 22, the liquid chamber 21 deforms for the liquid material to be ejected from a nozzle 25. In this case, a distortion amount of the piezoelectric element 22 is controlled by changing a value of the applied voltage. In addition, the distortion speed of the piezoelectric element 22 is controlled by changing a frequency of the applied voltage. The liquid droplet ejection by the piezoelectric system has an advantage in that it is difficult to affect the composition of a material because heat is not applied to the material.

Next, with reference to FIGS. 3A to 3D and 4A to 4D, a method for forming conductive film wiring on a substrate will be explained as an example of embodiments of the method for forming a wiring pattern (method for forming a thin film pattern) according to the present invention. The wiring pattern forming method according to this embodiment disposes ink for a wiring pattern mentioned above on the substrate P, and forms a conductive film pattern for wiring on the substrate P. This is schematically constituted by a bank forming step, a residue treatment step, a liquid-repelling processing step, a material arrangement step and an intermediate drying step, and a baking step.

Hereafter, every step will be explained in detail.

(Bank Formation Step)

A bank is a member which functions as a partition member, and the formation of the bank can be performed by an arbitrary method such as a lithography method or a printing method. For example, when the lithography method is used, an organic system photosensitive material is applied on the substrate P according to the height of the bank by a predetermined method such as spin coating, spray coating, roll coating, dye coating, or dip coating, and a resist layer is applied thereon it. Then, the resist coinciding with a bank shape is left by giving a mask coinciding with the bank shape (wiring pattern), and exposing and developing the resist. Finally, the bank material in portions except the mask is removed by etching. In addition, a bank (convexity) by two or more layers which are constituted by a lower layer which is an inorganic substance or an organic substance and is made of a material which exhibits liquid-affinity to function liquid, and an upper layer made of a material which is an organic substance and exhibits liquid-repellency, may be formed.

Figure 3A:
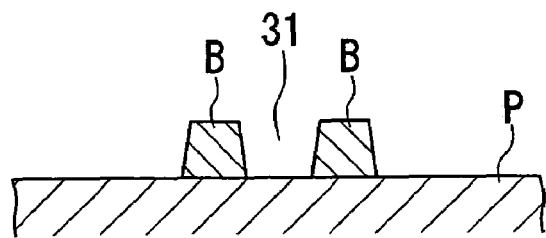
FIGS. 3A to 3D show the procedure of forming a wiring pattern according to a first embodiment.

Thereby, as shown in FIG. 3A, banks B and B are provided in a protruding manner, for example, at 10 μm width so that the banks may surround a groove 31 which is a region where a wiring pattern should be formed.

Figure 3B:
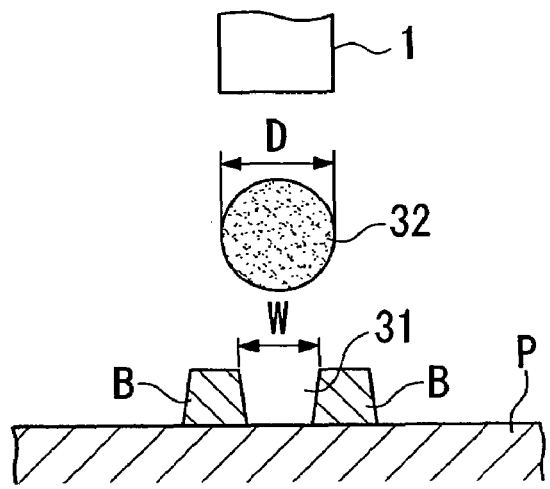
Figure 3C:
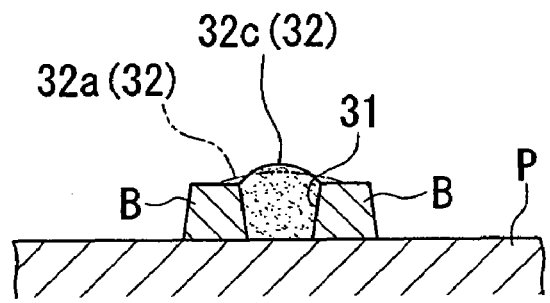
Figure 3D:
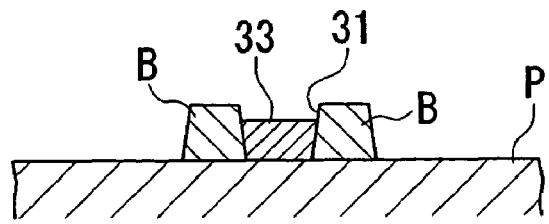

In addition, although HMDS treatment (method for applying $(CH_3)_3SiNHSi(CH_3)_3$ in a vapor state) is given to the substrate P as a surface reform treatment before organic material coating, this treatment is omitted in FIGS. 3A and 3D.

A material originally showing liquid-repellency to a liquid material may also be used as the organic material forming banks. In addition, as described below, an electrically insulating organic material which can be made liquid repellent by plasma processing, has sufficient adhesion with a base substrate, and is easy to be given patterning by photolithography, may be used. For example, it is possible to use a polymeric material such as an acrylic resin, a polyimide resin, an olefine resin, or a melamine resin.

(Residue Treatment Step (Liquid-affinity Treatment Step))

Next, in order to remove the resist (organic substance) residue between banks at the time of the bank formation, residue treatment is performed on the substrate P.

As the residue treatment, although ultraviolet light (UV) irradiation treatment in which residue treatment is performed by irradiating with ultraviolet light, $O_2$ plasma processing in which an oxygen process gas is used in an ambient air, or the like can be selected, the $O_2$ plasma processing is performed.

Specifically, this is performed by emitting oxygen plasma from a plasma ignition electrode to the substrate P. As conditions for the $O_2$ plasma processing, for example, plasma power of 50 to 1000 W, an oxygen gas flow of 50 to 100 ml/min, plate transportation speed of the substrate P to a plasma ignition electrode of 0.5 to 10 mm/sec, and substrate temperature of 70 to 90° C.

In addition, when the substrate P is a glass substrate, its surface has liquid-affinity to a wiring pattern formation material, but it is possible to increase the liquid-affinity of the groove 31 by performing the $O_2$ plasma processing or UV irradiation treatment in the same way of this embodiment for residue treatment. In this embodiment, the plasma processing conditions were adjusted so that a contact angle of the groove 31 to the organic silver compound (mentioned below) used as a wiring pattern formation material might become 10° or less (for example, transfer speed of the substrate P was reduced and plasma processing time was increased).

(Liquid-repelling Treatment Step)

Then, liquid-repelling treatment is performed on the banks B and B and liquid-repellency is imparted to their surfaces. As the liquid-repelling treatment, it is possible to adopt a plasma processing method ($CF_4$ plasma processing method) which makes tetrafluoromethane a process gas, for example in an ambient air. As conditions for the $CF_4$ plasma processing, for example, plasma power of 50 to 800 W, a tetrafluoromethane gas flow of 50 to 100 ml/min, plate transportation speed of the substrate P to a plasma ignition electrode of 0.5 to 1020 mm/sec, and substrate temperature of 70 to 90° C.

In addition, as the process gas, it is possible to use not only a tetrafluoromethane (carbon tetrafluoride) gas but also fluorocarbon system gases. In this embodiment, the plasma processing conditions were adjusted so that a contact angle of the bank B to the organic silver compound used as a wiring pattern formation material might become 60° or larger (for example, transfer speed of the substrate P was reduced and plasma processing time was increased).

By performing such liquid-repelling treatment, a fluorine group is introduced into a resin, which constitutes the banks B and B, in these and high liquid-repellency is given to the groove portion 31. In addition, the $O_2$ plasma processing as liquid-affinity treatment mentioned above may be performed before the formation of the bank B. Nevertheless, since there is the property that the acrylic resin, polyimide resin, etc., are more easily fluorinated (liquid-repellent) by the $O_2$ plasma preprocessing, it is preferable to perform the $O_2$ plasma processing after the formation of the banks B and B.

In addition, a surface of the substrate P to which the liquid-affinity treatment was previously imparted is affected in some degree by the liquid-repelling treatment to the banks B and B. Nevertheless, in particular, when the substrate P is made of glass and the like, the introduction of the fluorine group by the liquid-repelling treatment does not occur. Hence, the liquid-affinity, i.e., wettability of the substrate P is not spoiled substantially.

Furthermore, the liquid-repelling treatment of the banks B and B may be omitted by forming the banks B and B with a material (for example, a resin material having a fluorine group) which has liquid-repellency.

The substrate for thin film patterning is formed by these steps of the bank formation step, residue treatment step, and liquid-repelling treatment step.

(Material Arrangement Step and Intermediate Drying Step)

Next, a wiring pattern formation material is applied on the groove 31 on the substrate P by using the liquid droplet ejecting method by the liquid droplet ejecting apparatus IJ. In addition, the dispersion liquid where conductive fine particles are dispersed in a solvent (dispersion medium) is ejected as function liquid (ink for wiring patterns) here. As the conductive fine particles used here, fine particles of conductive polymer or superconductor besides metal fine particles containing any of gold, silver, steel, palladium, and nickel may be used.

That is, in the material arrangement step, while the liquid droplet ejecting head 1 of the above-mentioned liquid droplet ejecting apparatus IJ and the substrate P are relatively moved, as shown in FIG. 3B, a liquid material containing a wiring pattern formation material is ejected from the liquid ejecting head 1 as a liquid droplet 32. Then, the liquid droplet 32 is disposed in the groove 31 on the substrate P.

Specifically, by ejecting a plurality of liquid droplets 32 at predetermined pitches while relatively moving the liquid droplet ejecting head 1 and substrate P along the longitudinal direction (the formation direction of a wiring pattern) of the groove 31, the linear wiring pattern is formed.

In addition, as conditions for liquid droplet ejecting, ink weight was 7 ng/dot, and ink speed (ejecting speed) was 5 to 7 m/sec. In addition, in this example, it is assumed that the diameter D of the liquid droplet 32 is larger than the width W of the groove portion 31 in the banks B and B (in this example, the width of the groove portion 31 in an opening). Specifically, it is assumed that the width W of the groove portion 31 in the opening is about 10 μm or less, and, the diameter D of the liquid droplet 32 is about 20 to 23 μm.

When the liquid droplet 32 like this is ejected from the liquid droplet ejecting head 1 and a liquefied object is disposed in the groove portion 31, the liquid droplet 32 placed on these banks B and B is repelled from the banks B and B since the surfaces of the banks B and B are liquid repellent and moreover each have a tapered shape. Furthermore, because of the capillary phenomenon of the groove 31, the liquid droplet 32 flows into this groove 31.

Figure 4A:
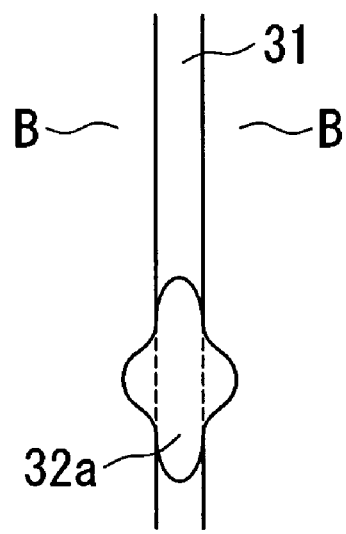
FIGS. 4A to 4C are diagrams for explaining the behavior of ejected liquid objects.

However, since the diameter D of the liquid droplet 32 is larger than the width W of the groove portion 31, some of the liquid bit (mass) (shown by symbol 32a) which is ejected may overflow and be left on the banks B and B as shown in FIG. 4A (shown by a chain double-dashed line in FIG. 3C).

Then, although the liquid droplet 32 is continuously ejected at a position inside the groove 31 which is apart by a pitch L, this ejection pitch L is made L>D (diameter of the liquid droplet). The size is set so that the liquid object is connected to an adjacent liquid object ejected apart by the pitch L when the liquid material (liquid droplet) ejected in the groove 31 wets and spreads, the size which was obtained by experiment, etc., beforehand.

Figure 4B:
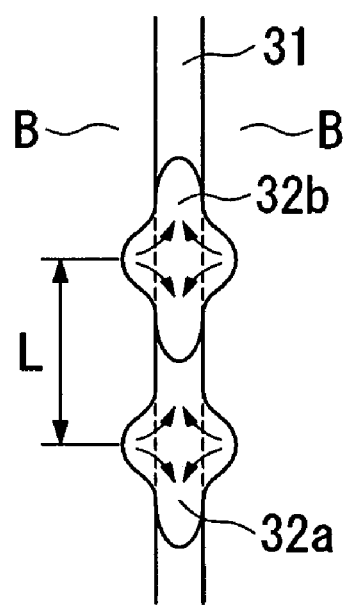
Figure 4C:
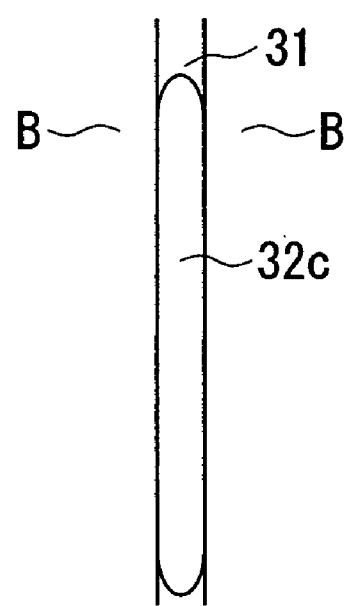

That is, as shown in FIG. 4B, the liquid bit (shown by symbol 32b) ejected by the distance L apart from the liquid bit 32a wets and spreads to connect with the liquid bit 32a which was ejected previously. A portion may overflow and remain on the banks B and B also in the liquid material 32b at this time. Nevertheless, since contact areas pull against each other when the liquid objects 32a and 32b connect, the liquid object remaining on the banks B and B are drawn into the groove 31 as shown by arrows in the figure. As a result, as shown by symbol 32c in FIGS. 3C and 4C, the liquid objects enter into the groove 31 and are formed in a line without overflowing the banks B and B.

In addition, the liquid objects 32a and 32b ejected into the groove 31 or which flowed down from the banks B and B more easily spread since the substrate P was imparted by the liquid-affinity treatment. Hence, the liquid bits 32a and 32b fill the groove 31 more uniformly. Therefore, the liquid bit 32 (liquid bits 32a and 32b) ejected toward the inside of the groove 31 favorably enter into the groove 31 without remaining on the banks B and B in spite of the width W of the groove 31 being narrower (smaller) than the diameter D of the liquid droplet 32, and fills up this groove 31 uniformly.

(Intermediate Drying Step)

After ejecting a liquid droplet to the substrate P, drying treatment (intermediate drying) is performed if necessary for removal of a dispersion medium. It is possible to perform the drying treatment by heat treatment performed by, for example, a normal hot plate, an electric furnace, and the like which heats the substrate P. In this embodiment, for example, the 180° C. heating is performed for 60 minutes. It is not necessary to perform this heating in the air, but this is also sufficient in an $N_2$ atmosphere and the like.

In addition, it is also possible to perform this drying treatment by lamp annealing.

Although a light source of the light used for the lamp annealing is not limited especially, it is possible to use an infrared lamp, a xenon arc lamp, a YAG laser, an argon laser, a $CO_2$ laser, or an excimer laser, using such as XeF, XeCl, XeBr, KrF, KrCl, ArF, or ArCl, as a light source. Generally, although light sources having the output range of 10 to 5000 W are used as these light sources, those having an output range of 100 to 1000 W are sufficient in this embodiment.

By repeatedly performing this intermediate drying step and the above-mentioned material arrangement step, two or more layers of liquid droplets of ink are stacked, and a wiring pattern (thin film pattern) with high compactness is formed.

(Baking Process)

It is necessary to remove the dispersion medium thoroughly from the dried film after the ejecting step in order to improve electrical contact between fine particles. In addition, if a coating agent such as an organic substance is coated on the surfaces of conductive fine particles in order to enhance dispersibility, it is necessary to also remove this coating agent. Therefore, heat treatment and/or light irradiation treatment are performed to the substrate after the ejecting step.

Although the heat treatment and/or light irradiation treatment are usually performed in the air, they can also be performed in the atmosphere of an inert gas such as a nitrogen, argon, or helium gas if necessary. The treatment temperature of the heat treatment and/or light irradiation treatment is suitably determined in consideration of the boiling point (steam pressure) of a dispersion medium, the type and pressure of an atmospheric gas, the thermal behavior of fine particles such as dispersibility and oxidizability, the existence and amount of a coating agent, the heatproof temperature of a base material, and the like.

For example, in order to remove the coating agent consisting of an organic substance, it is necessary to bake the substrate at about 300° C. In addition, when a substrate such as a plastic one is used, it is preferable to perform the baking in a range from room temperature to 100° C.

The dried film after the ejecting step is transformed into a conductive film since the electrical contact between fine particles is secured by the above steps. Hence, as shown in FIG. 3D, the conductive pattern as a film which is a linearly continuous film, i.e., a wiring pattern (thin film pattern) 33 is obtained.

EXAMPLE

A glass substrate on which banks had been formed was processed under conditions in which plasma power was 550 W, tetrafluoromethane gas flow was 100 ml/min, He gas flow was 10 L/min, and plate transportation speed to a plasma ignition electrode was 2 mm/sec. Then, a contact angle of a bank B before liquid-repelling treatment to dispersion liquid, in which conductive fine particles were dispersed in a solvent (dispersion medium), as function liquid (ink for wiring patterns) was 10° or less. Against this, the angle of the bank B after the liquid-repelling treatment was 54.0°. In addition, a contact angle of the bank B before the liquid-repelling treatment to deionized water had been 69.3°, but the angle of the bank B after the liquid-repelling treatment became 104.1°. Furthermore, in any case, a contact angle in the groove portion 31 of a glass substrate was 15° or lower.

Then, when the liquid droplets are ejected with a liquid droplet diameter D of about 20 μm (weight: 4.2 ng/dot) on this glass substrate and the pitch L was 40 μm and 50 μm, the liquid objects connected in the groove 31 without overflowing the banks B and B and being divided. Finally, it was possible to obtain a linear wiring pattern.

Thus, in this embodiment, it is possible to form a wiring pattern without leaving a liquid droplet on the banks B and B by ejecting a liquid droplet in the pitch L which is larger than the diameter D of a liquid droplet and enables adjacent liquid objects to connect. Hence, it is possible to prevent the degradation of a device such as wiring short-circuits. In particular, in this embodiment, a liquid droplet is ejected at a pitch which enables adjacent liquid bits to connect when wetting and spreading within the groove 31. Therefore, since the drawing force at the time of connection becomes large, it is possible to draw a liquid droplet more securely into the groove 31.

Moreover, in this embodiment, since the bank B is made to have a liquid-repellency higher than that of the groove 31, even if a part of ejected liquid droplet rides on the bank B, it is possible to repel the liquid droplet by liquid-repellency and to make it fall into the groove 31. Hence, since the liquid object can be applied more uniformly, it becomes possible to obtain the wiring pattern 33 which has uniform film thickness. In addition, in this embodiment, it is possible to fill the inside of the groove 31 with liquid objects even if the width of the groove 31 is smaller than the diameter of the liquid droplet 32. Hence, while it is possible to obtain a small device in which a wiring pattern of thinner lines is formed, and it is possible to obtain a high-quality device without defects such as a short circuit.

(Second Embodiment)

Next, with reference to FIGS. 5A to 5D and 6A to 6B, a method for forming conductive film wiring on a substrate will be explained as a second embodiment of the method for forming a wiring pattern (method for forming a thin film pattern) according to the present invention. The method for forming a wiring pattern according to this embodiment disposes ink for a wiring pattern mentioned above on the substrate P, and forms a conductive film pattern for wiring on the substrate P. This is schematically constituted by a surface treatment step, a material arrangement step, and a thermal treatment/light irradiation treatment step.

Hereinafter, each step will be explained in detail.

(Surface Treatment Step)

The surface treatment step is classified broadly into the liquid-repelling treatment step which reforms a substrate surface to be liquid-repellent, and the liquid-affinity treatment step which reforms the substrate surface, reformed to be liquid-repellent, to be made to have liquid-affinity.

At the liquid-repelling treatment step, the surface of the substrate on which conductive film wiring is formed is processed to be liquid-repellent to a liquid material. Specifically, a surface treatment is performed on the substrate so that a predetermined contact angle to a liquid material containing conductive fine particles may become 40° or larger, preferably, 50° or larger.

In a self-organizing film forming method, a self-organizing film consisting of an organic molecular film and the like is formed on the surface of the substrate on which conductive film wiring should be formed.

An organic molecular film for treating a substrate surface includes functional groups bondable with a substrate, a functional group for reforming the surface nature of a substrate (controlling surface energy) such as a liquid-affinity group or a liquid-repellent group, in its opposite side, and a carbon straight chain or a partially branched carbon chain for connecting these functional groups. This material bonds with the substrate, self-organizes, and forms a molecular film such as a monomolecular film.

Here, this self-organizing film includes a bonding functional group which can react with atoms constituting the base layer of a substrate, and other straight chain molecules, which is formed by orienting a compound which has an extremely high orientation characteristic due to the interaction of the straight chain molecules. Since this self-organizing film is made of oriented monomolecules, film thickness can be extremely thin, and is uniform at the molecular level. That is, since molecules with the same structures are positioned on the surface of the film, uniform and excellent lyophilic and repellency characteristics can be given to the surface of the film.

If fluoroalkylsilane, for example, is used for the compound having a high orientation characteristic, the self-organizing film is formed by each compound being oriented such that the fluoroalkyl group positions on the surface of the film, so that the surface of the film can be made uniformly repellent.

Compounds for forming such a self-organizing film are fluoroalkylsilane (hereafter, "FAS") such as heptadecafluoro-1,1,2,2 tetrahydrodecyltriethoxysilane, heptadecafluoro-1,1,2,2 tetrahydrodecyltrimethoxysilane, heptadecafluoro-1,1,2,2 tetrahydrodecyltrichlorosilane, tridecafluoro-1,1,2,2 tetrahydrooctyltriethoxysilane, tridecafluoro-1,1,2,2 tetrahydrooctyltrimethoxysilane, tridecafluoro-1,1,2,2 tetrahydrooctyltrichlorosilane and trifluoropropyltrimethoxysilane. For use, it is preferable to use one compound, but two or more types of compounds may be combined. In addition, it is possible to obtain adhesion with the substrate and good repellency by using the FAS.

The FAS is generally expressed by a constitutional formula $RnSiX_{(4-n)}$. Here n is an integer between 1 and 3 inclusive, X is a hydrolytic group such as the methoxy group, ethoxy group and halogen atoms. In addition, R is a fluoroalkyl group, which has the structure $(CF_3)(CF_2)_x(CH_2)_y$ (where x is an integer between 0 and 10 inclusive, y is an integer between 0 and 4 inclusive), and if a plurality of groups R or X are combined with Si, then all the groups R or X may be the same or different. The hydrolytic group expressed by X forms silanol by hydrolysis, and bonds with the substrate by siloxane bonding by reacting with the hydroxyl group in the base layer of the substrate (glass, silicon). On the other hand, R has a fluoro group such as $(CF_2)$ on the surface, which reforms the base layer surface of the substrate into a surface which is difficult to become wet (surface energy is low).

The self-organizing film comprising an organic molecular film is formed on the substrate when the above-mentioned raw material compound and the substrate are set in the same sealed container and left for 2 to 3 days at room temperature. In addition, when the entire sealed container is held at 100° C., the self-organizing film is formed on the substrate in about three hours. This is a method for forming self-organizing film from a vapor phase, but self-organizing film can be formed from a liquid phase as well. For example, when the substrate is dipped into a solution containing the raw material compound, and is cleaned and dried, the self-organizing film is generated on the substrate.

In addition, it is desirable to perform pretreatment on the surface of the substrate by irradiating with ultraviolet light, or by cleaning it by using a solvent before forming the self-organizing film.

Figure 5A:
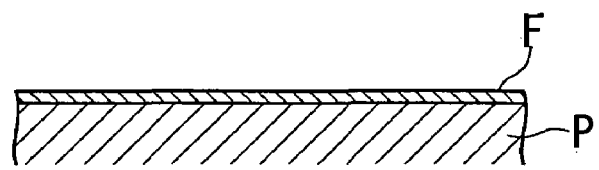
FIGS. 5A to 5D show the procedure of forming a wiring pattern according to a second embodiment.

Thus, by performing the self-organizing film forming method, as shown in FIG. 5A, the liquid-repellent film F is formed on the surface of the substrate P.

Next, the wettability of a substrate surface is controlled by applying a wiring pattern formation material to reduce the liquid-repellency of an application region where a wiring pattern should be formed, and imparting liquid-affinity (liquid-affinity treatment).

Hereafter, liquid-affinity treatment will be explained.

Figure 5B:
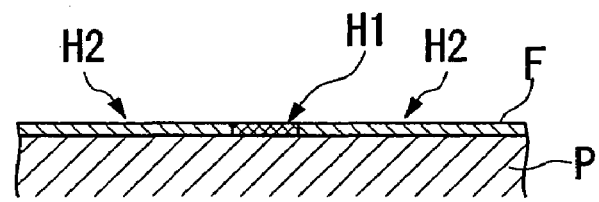

A method for irradiating ultraviolet light at the wavelength of 170 to 400 nm can be used for the liquid-affinity treatment. At this time, by irradiating ultraviolet radiation by using a mask according to a wiring pattern, it is possible to selectively reform only a wiring part in the once formed liquid-repellent film F, to reduce its liquid-repellency, and reforms the part to be made to have liquid-affinity. That is, by performing the above-mentioned liquid-repelling treatment and liquid-affinity treatment, as shown in FIG. 5B, an application region H1, which was made liquid-affinity, in the position in which a wiring pattern should be formed, and a liquid-repellent area H2 constituted of a liquid-repellent film F in the both sides which sandwich the application region H1 in between are formed in the substrate P.

In addition, although it is possible to adjust the extent of reduction of liquid-repellency by the irradiation time of ultraviolet radiation, it is also possible to adjust the extent by the intensity and wavelength of ultraviolet radiation, in combination with heat treatment (heating), and the like. In this embodiment, ultraviolet light is irradiated in the condition that a contact angle of the application region H1 to the liquid material containing conductive fine particles may become 15° or less.

Furthermore, it is also possible to adopt a treatment, which exposes a substrate to an ozone atmosphere, as another liquid-affinity treatment.

(Material Arrangement Step)

Next, a wiring pattern formation material is applied on the application region H1 on the substrate P by using the liquid droplet ejecting method by the above-mentioned liquid droplet ejecting apparatus IJ. In addition, the dispersion liquid where conductive fine particles are dispersed in a solvent (dispersion medium) is ejected as function liquid (ink for wiring patterns) here. As the conductive fine particles used here, fine particles of a conductive polymer or a superconductor, in addition to metal fine particles containing any of gold, silver, steel, palladium, and nickel, are used.

Figure 5C:
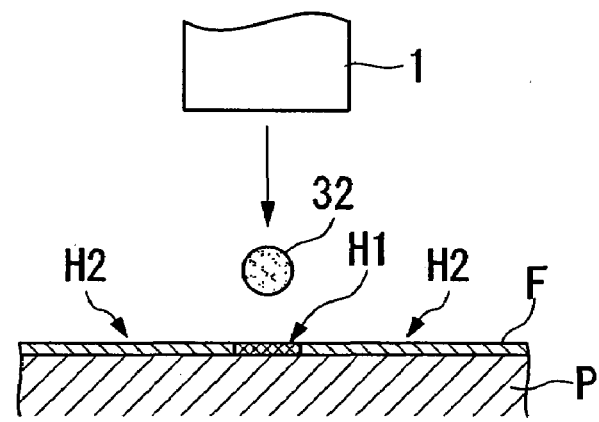

Then, in the material arrangement step, while the liquid droplet ejecting head 1 of the above-mentioned liquid droplet ejecting apparatus 1J and the substrate P are relatively moved, as shown in FIG. 5C, a liquid material containing a wiring pattern formation material is ejected from the liquid ejecting head 1 as a liquid droplet 32. Then, the liquid droplet 32 is disposed in the application region H1 on the substrate P. Specifically, by ejecting a plurality of liquid droplets 32 at predetermined pitches by relatively moving the liquid droplet ejecting head 1 and substrate P along the longitudinal direction (the formation direction of the wiring pattern) of the application region H1, the linear wiring pattern is formed.

In addition, as conditions for liquid droplet ejection, ink weight was 7 ng/dot, and the ink speed (ejection speed) was 5 to 7 m/sec.

Figure 5D:
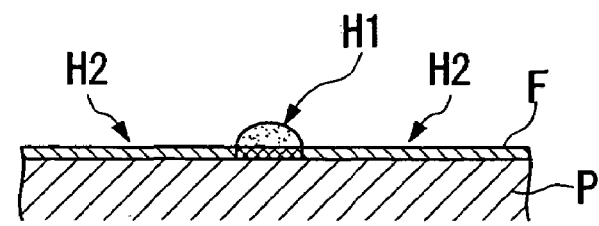

At this time, since the liquid-repellent area H2 is made liquid-repellent, even if some of the ejected liquid droplet ride on the liquid-repellent area H2, they are repelled from the liquid-repellent area H2, and as shown in FIG. 5D, it collects in the application region H1 between the liquid-repellent areas H2. In addition, the application region H1 is given liquid-affinity, and the ejected liquid object (bit) becomes easier to spread in the application region H1. Hence, the liquid object can fill the application region H1 within a predetermined position uniformly without being divided.

Figure 6A:
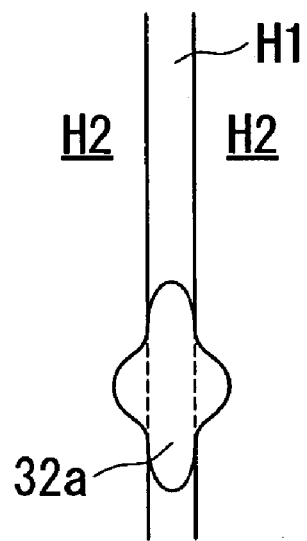
FIGS. 6A to 6C are diagrams for explaining the behavior of ejected liquid objects.

However, for example, when the width of the application region H1 is smaller than the diameter of the liquid droplet 32 (for example, when the diameter of the liquid droplet is about 20 µm and the width of the application region H1 is about 10 µm), as shown in a partial top view in FIG. 6A, a part of the ejected liquid object (shown by symbol 32a) may overflow and remain on the liquid-repellent area H2.

Thereafter, although the liquid droplet 32 is continuously ejected in a position inside the application region H1 which is apart by a pitch L, this ejecting pitch L is made L>D (diameter of the liquid droplet). The size is set so that the liquid object may connect with an adjacent liquid object ejected apart by the pitch L when the liquefied object (liquid droplet) ejected in the application region H1 wets and spreads, the size which was obtained by experiment, etc., beforehand.

Figure 6B:
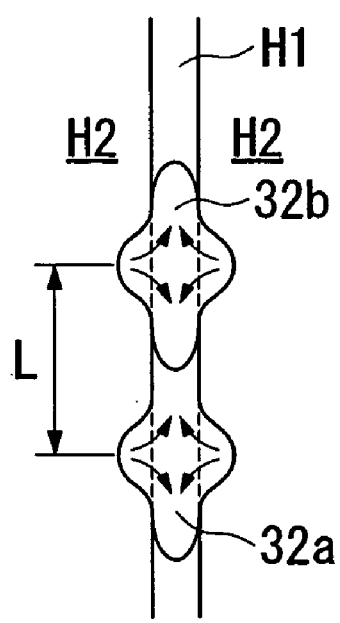
Figure 6C:
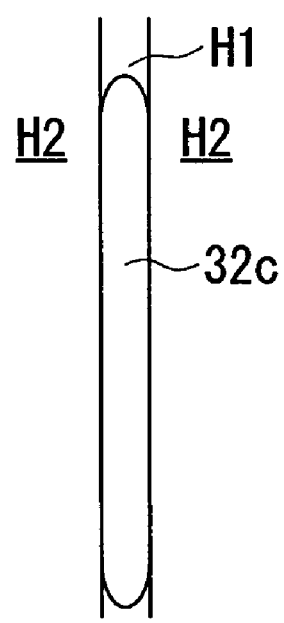

That is, as shown in FIG. 6B, the liquid object (shown by symbol 32b) ejected by the distance L apart from the liquid object 32a wets and spreads to connect with the liquid object 32a which was previously ejected. A part may overflow and remain on the liquid-repellent area H2 also in the liquid object 32b at this time. Nevertheless, since contact areas pull against each other when the liquid objects 32a and 32b connect, the liquid object remaining on the liquid-repellent area H2 is drawn into the application region H1 as shown by arrows in the figure. As a result, as shown by symbol 32c in FIG. 6C, the liquid objects are repelled (enter) into the application region H1 and are formed in a line without overflowing the liquid-repellent area H2.

In this case also, the liquid objects 32a and 32b ejected into the application region H1 or repelled from the liquid-repellent area H2 more easily spread since the substrate P is given the liquid-affinity treatment. Hence, the liquid objects 32a and 32b fill the application region H1 more uniformly. Therefore, the liquid droplet 32 (liquid objects 32a and 32b) ejected toward the inside of the application region H1 favorably enters into the application region H1 without remaining on the liquid-repellent area H2 in spite of the width of the application region H1 being narrower (smaller) than the diameter of the liquid droplet 32, and fills the application region H1 uniformly.

(Thermal Treatment/Light Irradiation Treatment Step)

Next, in a thermal treatment/light irradiation treatment step, the dispersion medium or coating agent contained in the liquid droplet disposed on the substrate is removed. That is, it is necessary to remove the dispersion medium thoroughly from the liquid material for conductive film formation, which is disposed on the substrate, in order to improve electrical contact between fine particles. In addition, if a coating agent such as an organic substance, is coated on the surfaces of conductive fine particles in order to enhance dispersibility, it is necessary to also remove this coating agent.

Although the heat treatment and/or light irradiation treatment are usually performed in the air, they may be also performed in the atmosphere of an inert gas such as a nitrogen, argon, or helium gas if necessary. The treatment temperature of the heat treatment and/or light irradiation treatment is suitably determined in consideration of the boiling point (vapor pressure) of a dispersion medium, the type and pressure of an atmospheric gas, the thermal behavior of fine particles such as dispersibility and oxidizability, the existence and amount of a coating agent, the heatproof temperature of a base material, and the like.

For example, in order to remove the coating agent consisting of an organic substance, it is necessary to bake the substrate at about 300° C. In addition, when a substrate such as a plastic one is used, it is preferable to perform the baking in a range from room temperature to 100° C. inclusive.

The heat treatment and/or light irradiation treatment may be performed by using lamp annealing besides general heat-treatment using heating means such as a hot plate and an electric furnace. Although a light source of the light used for the lamp annealing is not especially limited, it is possible to use an infrared lamp, a xenon arc lamp, a YAG laser, an argon laser, a $CO_2$ laser, or an excimer laser, using such as XeF, XeCl, XeBr, KrF, KrCl, ArF, or ArCl. Generally, although light sources having the output range of 10 to 5000 W are used as these light sources, those having the output range of 100 to 1000 W are sufficient in this embodiment.

The above-mentioned heat treatment and/or light irradiation treatment ensure the electrical contact between fine particles, and transform the liquid material into a conductive film.

The consecutive steps explained above form a linear conductive film pattern (conductive film wiring) on the substrate.

EXAMPLE

A glass substrate was placed as the substrate P into the same sealed container with the raw material compound of the self-organizing film consisting of an organic molecular film, etc. Then, the monomolecular film was formed on the substrate by holding the entire sealed container at 100° C. for about 3 hours. Moreover, the once formed liquid-repellent film was selectively broken by exposure treatment of ultraviolet light by using a mask according to the wiring pattern.

Although a contact angle in the liquid-repellent area H to the liquid material containing conductive fine particles was 60°, a contact angle in the application region H1 of the glass substrate was 15° or less.

Then, when the liquid droplets are ejected with a the liquid droplet diameter D of about 20 μm (weight: about 7 ng/dot) on this glass substrate and the pitch L was 40 μm and 50 μm, the liquid objects connected in the application region H1 without overflowing the liquid-repellent area H2 and being divided. Finally, it was possible to obtain a linear wiring pattern.

Thus, in this embodiment, it is possible to form a wiring pattern without leaving a liquid droplet on the liquid-repellent area H2 by ejecting a liquid droplet in the pitch L which is larger than the diameter of the liquid droplet and enables adjacent liquid objects to connect. Hence, it is possible to prevent the degradation of a device such as by wiring short-circuits. In particular, in this embodiment, a liquid droplet is ejected in a pitch which enables adjacent liquid objects to connect when wetting and spreading within the application region H1. Therefore, since the drawing force at the time of connection becomes large, it is possible to draw a liquid droplet more securely into the application region H1.

Moreover, in this embodiment, since the liquid-repellent area H2 is imparted a liquid-repellency higher than that of the application region H1, even if a part of an ejected liquid droplet rides on the liquid-repellent area H2, it is possible to repel a liquid droplet by liquid-repellency and to make it drawn into the application region H1. Hence, since the liquid object can be applied more uniformly, it becomes possible to obtain a wiring pattern which has uniform film thickness. In addition, in this embodiment, it is possible to fill the inside of the application region H1 with liquid objects even if the width of the applies area H1 is smaller than the diameter of the liquid droplet 32. Hence, while it is possible to obtain a small device in which a wiring pattern of thinner lines is formed, it is possible to obtain a high-quality device without defects such as a short circuit.

(Third Embodiment)

Figure 7:
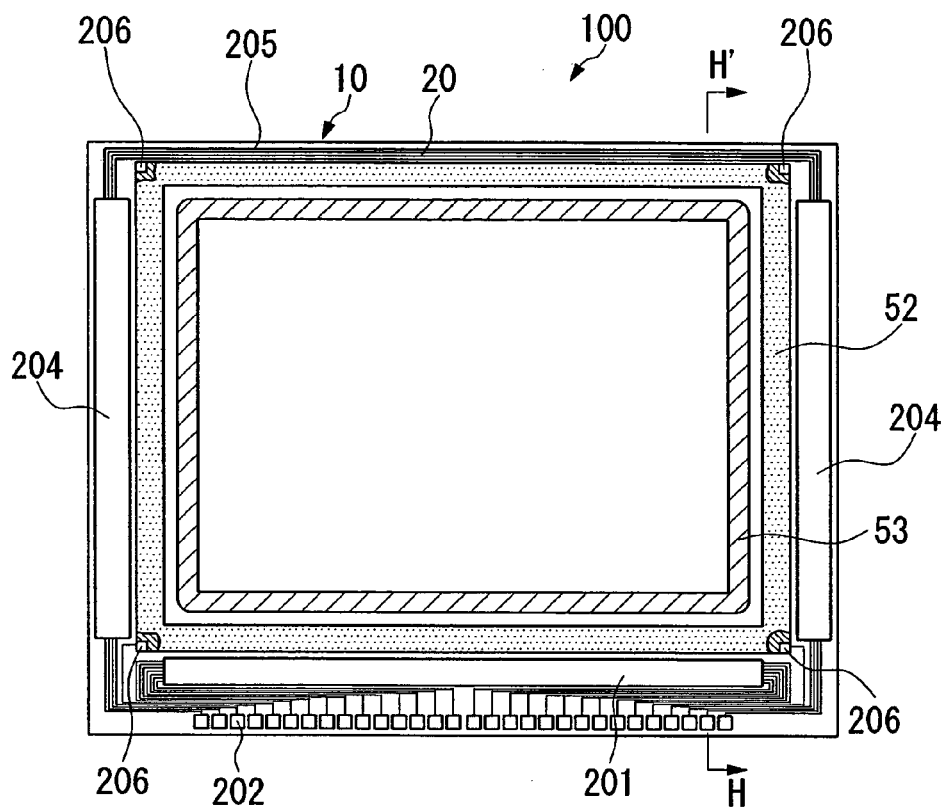
FIG. 7 is a top view of a liquid crystal display device in view of the opposing substrate side.
Figure 8:
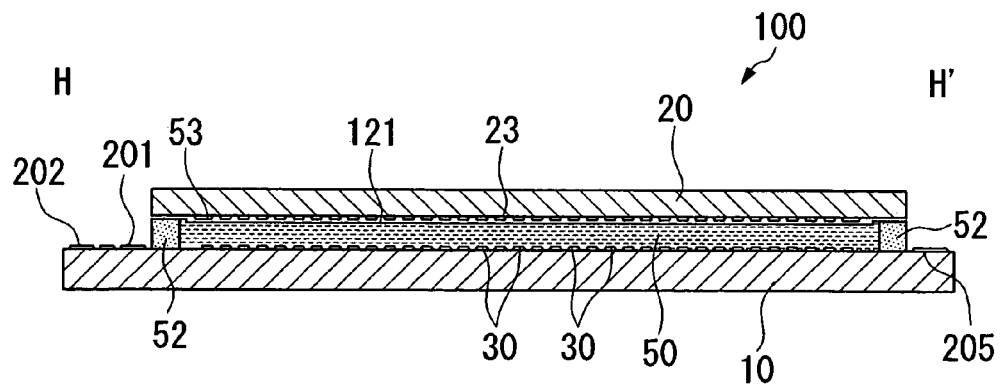
FIG. 8 is a sectional view taken along the line H—H in FIG. 7.
Figure 9:
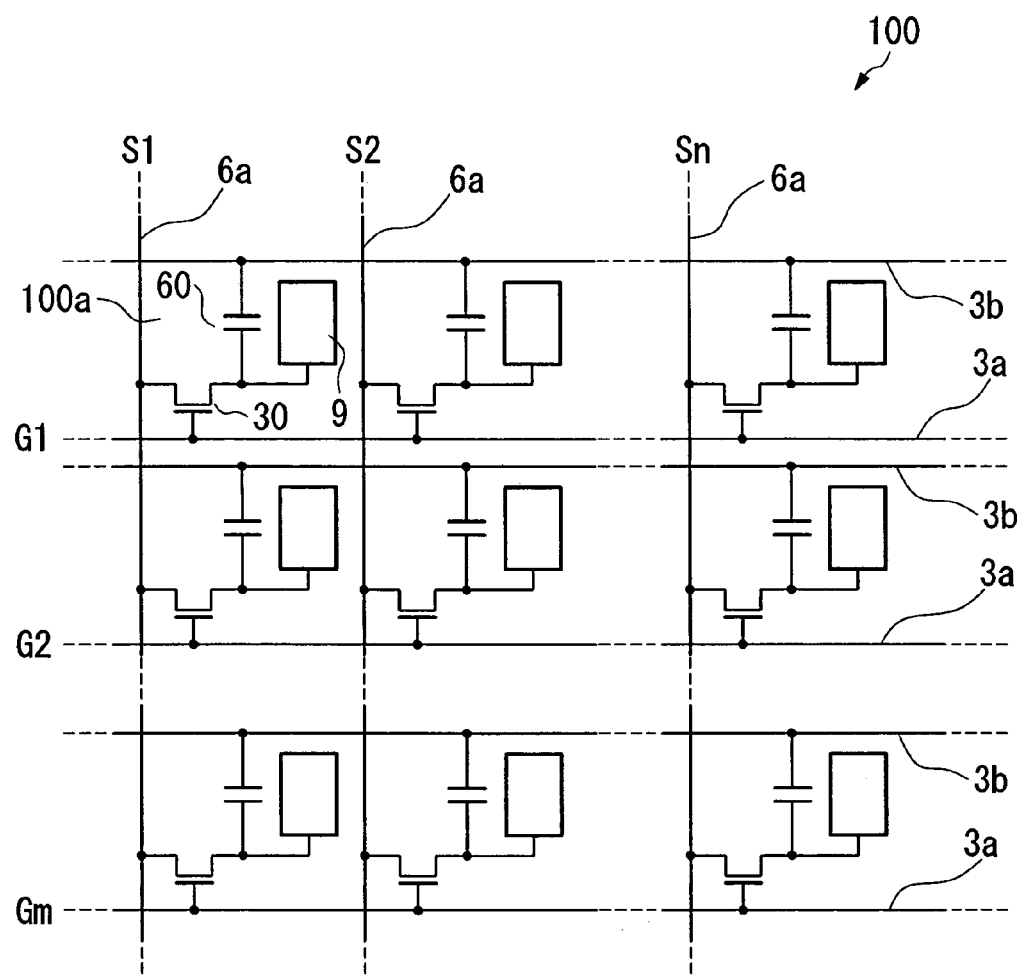
FIG. 9 is an equivalent circuit diagram of the liquid crystal display device.
Figure 10:
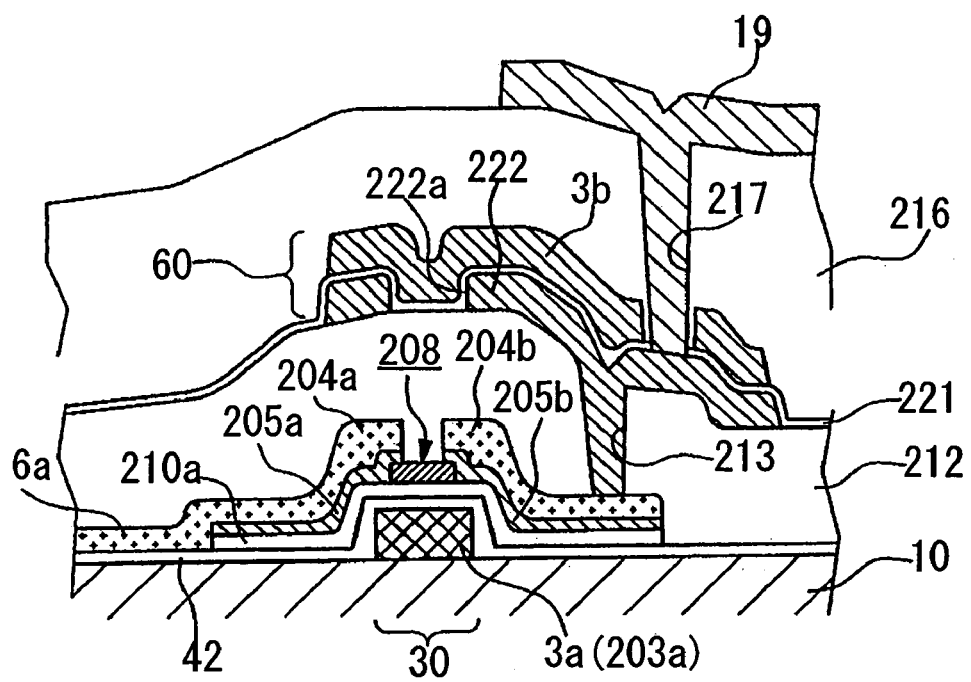
FIG. 10 is a partially enlarged sectional view of the liquid crystal display unit.

A liquid crystal display unit, as a third embodiment of the electro-optical apparatus of the present invention, is explained. FIG. 7 is a top view of the liquid crystal display unit according to the present invention in view of an opposing substrate side which is shown with each component. FIG. 8 is a sectional view taken along the line H—H in FIG. 7. FIG. 9 shows equivalent circuit diagrams such as various devices and wiring in a plurality of pixels formed in a matrix form in the image display region of the liquid crystal display unit. FIG. 10 is the partially enlarged sectional view of the liquid crystal display unit. In addition, in respective drawings used for the following explanations, the scale is changed for each layer or each member so that each layer and each member is of a size which can be depicted on the drawing.

In FIGS. 7 and 8, in the liquid crystal display unit (electro-optical apparatus) 100 of this embodiment, a TFT array substrate 10 and an opposing substrate 20, which make a pair, are adhered with a sealant 52 which is a photo-curing sealing agent. Liquid crystal 50 is enclosed and held in a region partitioned by this sealant 52. The sealant 52 is formed in the shape of a frame which is closed in a region within the substrate surface, does not include a liquid crystal inlet, and is hidden from the eyes.

A peripheral parting 53 which consists of a light blocking material is formed in the interior region of the formation region of the sealant 52. In the outer region of the sealant 52, a data line driving circuit 201 and the mounting terminal 202 are formed along one side of the TFT array substrate 10, and a scanning line driving circuit 204 is formed along two sides adjacent to this one side. A plurality of wiring 205 for connecting between the scanning line driving circuits 204 provided in both sides of the image display region is provided in the residual one side of the TFT array substrate 10. In addition, in at least one location of corner sections of the opposing substrate 20, an inter-substrate conductive material 206 for electrically connecting between the TFT array substrate 10 and opposing substrate 20 is arranged.

In addition, instead of forming the data line driving circuit 201 and scanning line driving circuit 204 on the TFT array substrate 10, for example, it is also sufficient to electrically and mechanically connect a TAB (Tape Automated Bonding) substrate, in which a driving LSI is mounted, with a terminal block, formed in the peripheral part of the TFT array substrate 10, via an anisotropic conductive film. In addition, in a liquid crystal display device 100, a phase difference plate, a polarizing plate, etc. are disposed in a predetermined direction according to the type of the liquid crystal 50 to be used, i.e., the kind of modes of operation such as a TN (Twisted Nematic) mode, a C-TN method, a VA system, and an IPS system, and a normally white mode/normally black mode. Illustration thereof is omitted here.

In addition, in the case of constituting the liquid crystal display device 100 for color display, in the opposing substrate 20, color filters of, for example, red (R), green (G), and blue (B) are formed with overcoat in regions which face respective pixel electrodes of the TFT array substrate 10, described below.

In the image display region of the liquid crystal display device 100 having such a structure, as shown in FIG. 9, while a plurality of pixels 100a is constituted in a matrix form, a TFT 30 for pixel switching (switching device) is formed in each of these pixels 100a. Data lines 6a which supply pixel signals S1, S2, . . . , Sn are electrically connected to sources of TFTs 30. The pixel signals S1, S2, . . . , Sn written in the data lines 6a may be supplied line by line in this order, or may be supplied also for every group which is constituted by a plurality of adjacent data lines 6a. In addition, scanning lines 3a are electrically connected to the gates of TFTs 30, and are constituted so that scanning signals G1, G2, . . . , Gm may be applied to the scanning lines 3a line by line in this order in predetermined timing in a pulse mode.

Each pixel electrode 19 is electrically connected to a drain of each TFT 30, and makes the TFT 30, which is a switching device, turn on only for a fixed period to write each of the pixel signals S1, S2, . . . , Sn supplied from the data lines 6a in each pixel in predetermined timing. Thus, the pixel signals S1, S2, . . . , Sn in predetermined level which are written in the liquid crystals via the pixel electrodes 19 are held for a fixed period between the opposing electrodes 121 of the opposing substrate 20 shown in FIG. 8. In addition, in order to prevent the held pixel signals S1, S2, . . . , Sn from leaking, accumulating capacitors 60 are added in parallel to liquid crystal capacitors, which each are formed between the pixel electrode 19 and opposing electrode 121. For example, the voltage of the pixel electrode 19 can be held by the accumulating capacitance 60 by a time period that is hundreds of times longer than that the source voltage is applied. Thereby, the holding property of electric charges improves and it is possible to achieve the liquid crystal display device 100 with a high contrast ratio.

FIG. 10 is a partially enlarged sectional view of the liquid crystal display device 100 which has bottom gate TFTs 30. In this embodiment, each accumulating capacitor 60 is built above each bottom gate TFT 30 for pixel switching. More specifically, a semiconductor layer 210a is stacked via a gate insulating film 42 on a gate electrode 203a portion projecting above the substrate along the data line 6a from the scanning line 3a on the TFT array substrate 10 (equivalent to the substrate P in the above-mentioned method for forming a wiring pattern). Let the portion of the semiconductor layer 210a which faces this gate electrode 203a portion be a channel region. On the semiconductor layer 210a, a source electrode 204a and a drain electrode 204b are formed from the same film as the data line 6a. Between the source electrode 204a and drain electrode 204b, and the semiconductor layer 210a, connecting layers 205a and 205b which each consist of, for example, an $n^+$ type a-Si (amorphous silicon) layer in order to obtain an ohmic junction, are stacked, respectively. Furthermore, on the semiconductor layer 210a in the center section of the channel region, an insulating etch stop film 208 for protecting a channel is formed. On the end section of the drain electrode 204b, an island-like capacitor electrode 222 is stacked via an interlayer insulation film 212. Moreover, on the capacitor electrode 222, a capacitor line 3b (capacitor electrode in the fixed potential side) is stacked via a dielectric film 221. Then, the capacitor lines 3b are extended in a stripe shape within the image display region, and are extended out of the image display region to be connected to the fixed potential.

The pixel electrode 19 is disposed above the accumulating capacitor 60, and the interlayer insulation film 216 is stacked between the capacity line 3b and pixel electrode 19. The pixel electrode 19 and capacity electrode 222 are connected via a contact hole 217 pierced in the interlayer insulation film 216, and making the capacity electrode 222 be pixel electrode potential. Then, in the capacitor electrode 222, a through hole-like opening 222a is provided in a region, which is above the channel region of the TFT 30.

In a TFT having the above-mentioned structure, a gate line, a source line, a drain wire, etc., can be formed by ejecting a liquid droplet for containing a silver compound by using the liquid droplet ejecting apparatus IJ mentioned above. Hence, it is possible to achieve miniaturization and thinning, and to obtain a high-quality liquid crystal display device without defects such as a short circuit.

(Fourth Embodiment)

In the above-mentioned embodiment, although the TFTs 30 are used as switching devices for the driving of the liquid crystal display device 100, this structure is also applicable to, for example, an organic electroluminescent display device in addition to a liquid crystal display device. An organic electroluminescent display device has a structure in which a thin film is sandwiched, including fluorescent inorganic and organic compounds, is sandwiched by a cathode and an anode. It is a device which generates excitons by injecting electrons and positive holes (holes) into the above-mentioned thin film and exciting them, and makes light emitted by using the emission of light (fluorescence and phosphorescence) when these excitons recombining. Then, it is possible to produce a self-luminescent full-color EL device by patterning materials emitting red, green, and blue luminescent colors respectively, i.e., luminous layer forming materials, and materials forming hole injection/electron transporting layer among the fluorescent materials used for an organic electroluminescent display devices on the substrate which has the above-described TFTs 30 as ink.

Such an organic electroluminescence device is also included in the scope of the device (electro-optical apparatus) in the present invention. It is possible to achieve the miniaturization and thinning, and to obtain the high-quality organic EL device without defects such as a short circuit.

Figure 11:
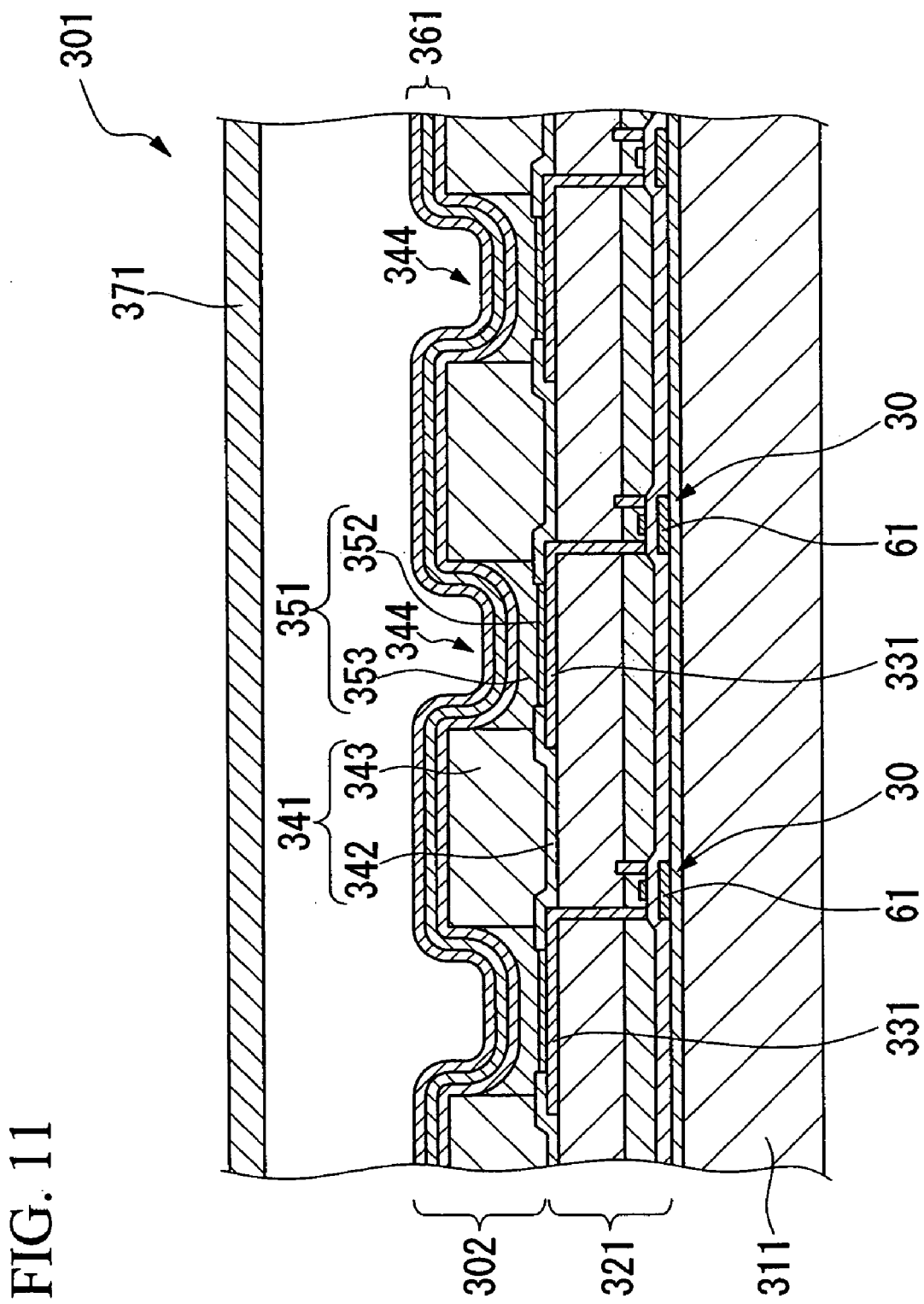
FIG. 11 is a partially enlarged sectional view of an organic EL unit.

FIG. 11 is a sectional side elevation of an organic EL unit some of whose components are produced by the above-mentioned liquid droplet ejecting apparatus IJ. The schematic construction of the organic EL unit will be explained with reference to FIG. 11.

In FIG. 11, an organic electroluminescent unit 301 is constituted by connecting wiring of a flexible board (not shown) and a driving IC (not shown) to an organic EL device 302 that includes a substrate 311, a circuit device section 321, pixel electrodes 331, bank sections 341, light emitting devices 351, a cathode 361 (opposing electrode), and a sealing substrate 371. The circuit device section 321 is constituted by forming the TFTs 30, which are active devices, on the substrate 311, and aligning a plurality of pixel electrodes 331 on the circuit device section 321. Then, the gate wiring 61 which constitutes the TFTs 30 is formed by the forming method for a wiring pattern according to the embodiment mentioned above.

Between respective pixel electrodes 331, the bank section 341 is formed in a grid shape, and the light emitting device 351 is formed in a concavity opening 344 caused by the bank section 341. In addition, the light emitting device 351 consists of a device which emits red light, and device which emits green light, and an device which emits blue light, and hence, the organic EL unit 301 achieves the full color display thereby. The cathode 361 is formed all over the bank section 341 and light emitting device 351, and the sealing substrate 371 is stacked on the cathode 361.

The production process of the organic electroluminescent unit 301 including the organic EL device includes a bank section forming step which forms the bank sections 341, a plasma processing step for adequately forming the light emitting devices 351, a light emitting device forming step which forms light emitting devices 351, an opposing electrode forming step which forms the cathode 361, and a sealing step which stacks and encapsulates the sealing substrate 371 on the cathode 361.

The light emitting device forming step forms the light emitting device 351 by forming the hole injection layer 352 and a luminous layer 353 on a concavity opening 344, i.e., the pixel electrode 331, and includes a hole injection layer forming step and a luminous layer forming step. Then, the hole injection layer forming step includes a first ejecting step which ejects a liquid object material for forming the hole injection layer 352 on each pixel electrode 331, and a first drying step which dries the ejected liquid object material and forms the hole injection layer 352. In addition, the luminous layer forming step includes a second ejecting step which ejects a liquid object material for forming the luminous layer 353 on the hole injection layer 352, and a second drying step which dries the ejected liquid object material and forms the luminous layer 353. In addition, as described above, three kinds of luminous layers 353 are formed according to materials corresponding to three colors of red, green, and blue, and hence, the above-mentioned second ejecting step includes three steps so as to eject three kinds of materials respectively.

In this light emitting device forming step, the above-mentioned liquid droplet ejecting apparatus IJ can be used at the first ejecting step in the hole injection layer forming step, and the second ejecting step in the luminous layer forming step.

(Fifth Embodiment)

In the embodiment mentioned above, although the gate wiring of the TFT (thin-film transistor) is formed by using the pattern forming method according to the present invention, it is also possible to produce other components, such as a source electrode, a drain electrode, and a pixel electrode. Hereafter, a method for producing a TFT will be explained with reference to FIGS. 12 to 15.

Figure 12:
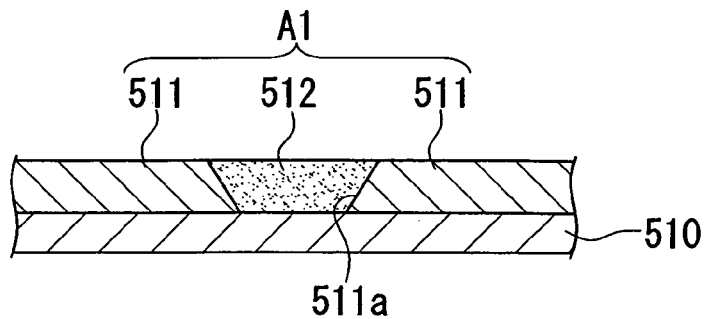
FIG. 12 is a diagram for explaining a step of producing a thin film transistor.

As shown in FIG. 12, a first layer of bank 511 for providing a groove 511a at ½0 to ⅒ of one pixel pitch is first formed on the upper surface of a cleaned glass substrate 510 using a photolithography method. It is necessary for this bank 511 to be optical transparent and liquid-repellent after formation, and those suitably used as materials therefor are inorganic materials such as polysilazane in addition to polymeric materials such as an acrylic resin, a polyimide resin, an olefine resin, and a melamine resin.

In order to impart liquid-repellency to the bank 511 after this formation, it is necessary to perform $CF_4$ plasma processing (plasma processing using a gas which has a fluorine component) etc., but instead, the material of the bank 511 itself may be filled with a liquid-repellent component (fluorine group etc.) beforehand. In this case, $CF_4$ plasma processing, etc., may be omitted.

It is preferable to secure a contact angle of 40° or more for the bank 511, which is reformed to be liquid-repellent as described above, to the ejected ink, and 10° or less as a contact angle of a glass surface. That is, as a result of the verification of the present inventors by experiment, it is possible to secure about 54.0° (10° or less without treatment) as a contact angle after the treatment of the conductive fine particles (tetra-decane solvent) when an acrylic resin system is adopted as a material of the bank 511. In addition, these contact angles were obtained under treatment conditions such that a tetrafluoromethane gas was supplied at 0.1 L/min under a plasma power of 550 W.

At the gate scan electrode forming step (first conductive pattern forming step) following the above-mentioned first layer of bank forming step, the gate scanning electrode 512 is formed by ejecting a liquid droplet including a conductive material by an ink jet so as to fill the inside of the above-mentioned groove 511a which is a drawing area partitioned by the bank 511. Then, when forming the gate scanning electrode 512, the method for forming a pattern according to the present invention is applied.

As a conductive material at this time, Ag, aluminum, Au, Cu, palladium, Ni, W—Si, a conductive polymer, etc., can be suitably adopted. Thus, since sufficient liquid-repellency for bank 511 is given beforehand, the gate scanning electrode 512 formed as described above can be formed in a fine wiring pattern without overflowing the groove 511a.

A first electroconductive layer Al made of silver (Ag) having a flat top face comprising the bank 511 and gate scanning electrode 512 on the substrate 510 owing to the above steps.

In addition, in order to obtain the good ejection result in the groove 511a, as shown in FIG. 12, it is preferable to adopt a semi-tapered shape (tapered shape opening toward the discharger) as a shape of this groove 511a. Owing to this, it becomes possible to make the ejected liquid droplet enter deeply thereinto.

Figure 13:
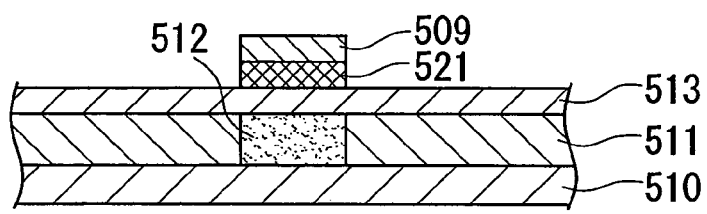
FIG. 13 is a diagram for explaining a step of producing a thin film transistor.

Next, as shown in FIG. 13, the continuous deposition of the gate insulating film 513, an active layer 521, and a contact layer 509 is performed by a plasma CVD method. A silicon nitride film for the gate insulating film 513, an amorphous silicon film for the active layer 521, and an $n^+$ type silicon film for the contact layer 509 are formed by changing material gases and plasma conditions. When forming by the CVD method, 300 to 350° C. heat history is required, but it is possible to avoid problems in transparency and heat resistance by using an inorganic material for the bank.

Figure 14:
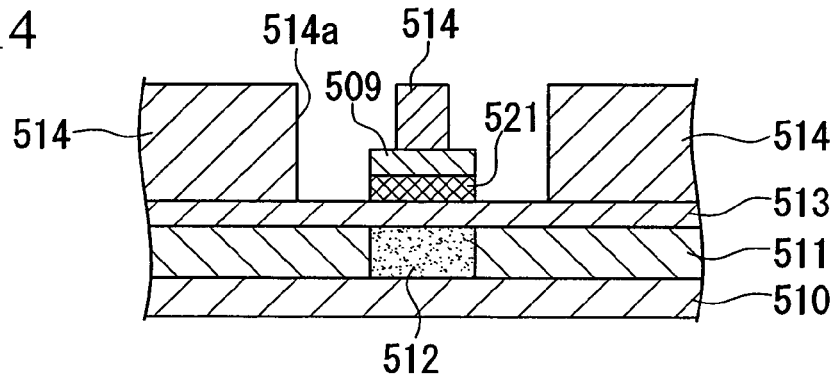
FIG. 14 is a diagram for explaining a step of producing a thin film transistor.

At a second layer of a bank forming step following the above-mentioned semiconductor layer forming step, as shown in FIG. 14, a second layer of bank 514 for providing the groove 514a, which is ½0 to ⅒ of one pixel pitch and intersects with the above-mentioned groove 511a, is formed on the gate insulating film 513 using a photolithography method. It is necessary for this bank 514 to be optically transparent and liquid-repellency after formation, and those suitably used as materials therefor are inorganic materials such as polysilazane in addition to polymeric materials such as an acrylic resin, a polyimide resin, an olefine resin, and a melamine resin.

In order to impart liquid-repellency to the bank 514 after this formation, it is necessary to perform $CF_4$ plasma processing (plasma processing using a gas which has a fluorine component) etc., but instead, the material of the bank 514 itself may be filled with a liquid-repellent component (fluorine group etc.) beforehand. In this case, $CF_4$ plasma processing, etc., may be omitted.

It is preferable to secure a contact angle of 40° or more for the bank 514, which is reformed to be liquid-repellent as described above, to the ejected ink.

Figure 15:
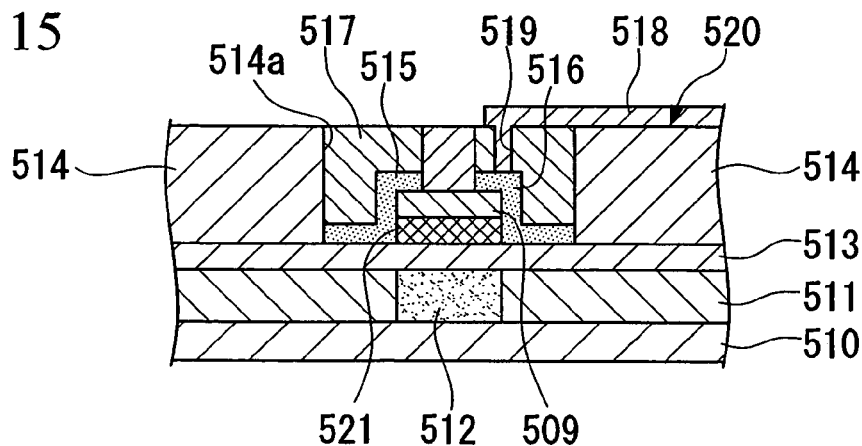
FIG. 15 is a diagram for explaining a step of producing a thin film transistor.

At a source/drain electrode forming step (second conductive pattern forming step) following the above-mentioned second layer of bank forming step, the source electrode 515 and drain electrode 516, which intersect with the above-mentioned gate scanning electrode 512 as shown in FIG. 15, are formed by ejecting a liquid droplet including a conductive material by an ink jet so as to fill the inside of the above-mentioned groove 514a which is a drawing area partitioned by the bank 514. Then, when forming the source electrode 515 and drain electrode 516, the method for forming a pattern according to the present invention is applied.

As a conductive material at this time, Ag, aluminum, Au, Cu, palladium, Ni, W—Si, a conductive polymer, etc., can be suitably adopted. Thus, since sufficient liquid-repellency for bank 514 is provided beforehand, the source electrode 515 and drain electrode 516 formed as described above can be formed in a fine wiring pattern without overflowing the groove 514a.

In addition, an insulator 517 is disposed so that the groove 514a where the source electrode 515 and drain electrode 516 are disposed may be filled. A flat top surface 520 comprising the bank 514 and insulator 517 is formed on the substrate 510 owing to the above steps.

Then, while forming a contact hole 519 in the insulator 517, a pixel electrode (ITO) 518 patterned on the top surface 520 is formed, and the TFT is formed by connecting the drain electrode 516 and pixel electrode 518 via the contact hole 519.

(Sixth Embodiment)

Figure 16:
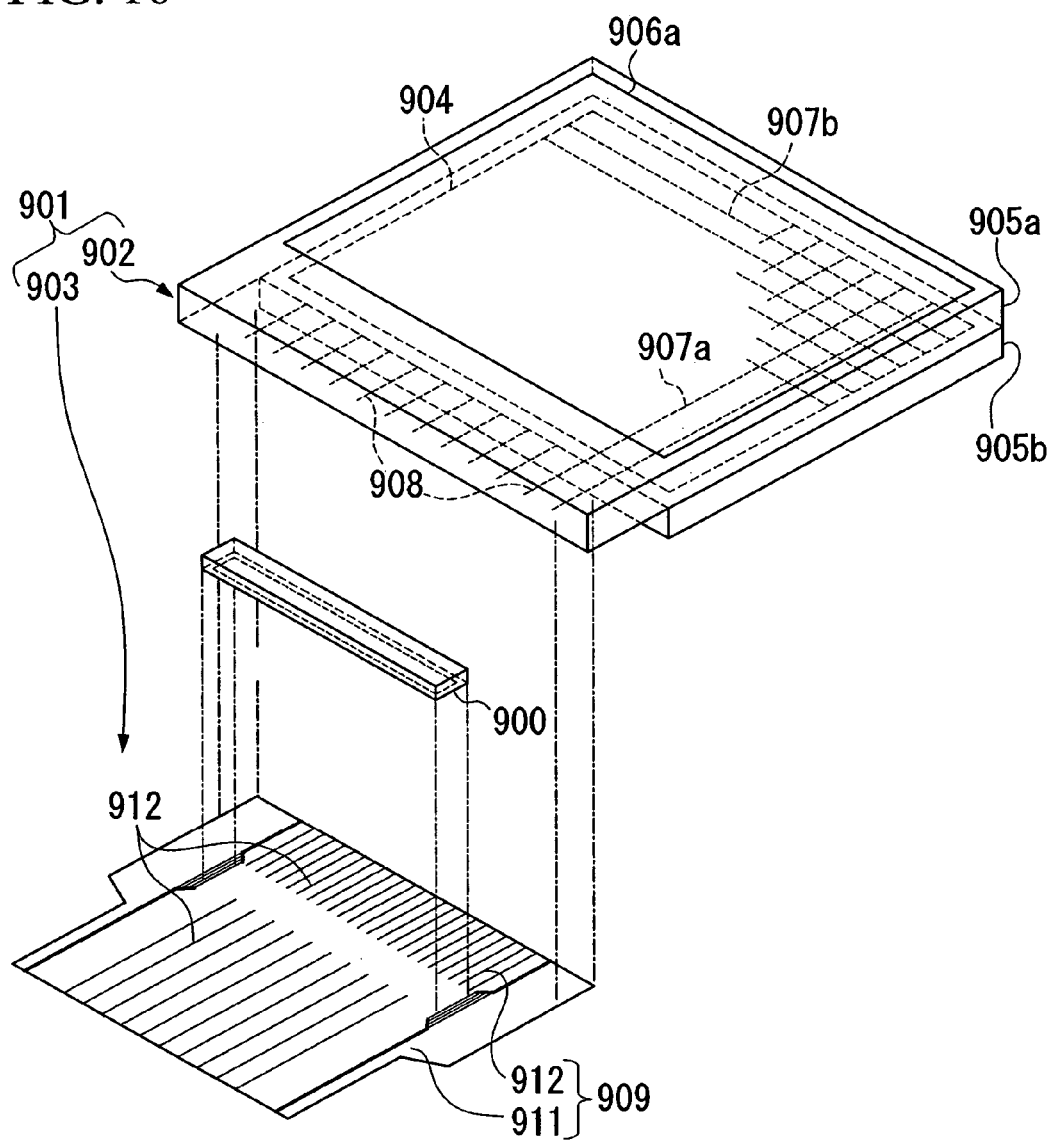
FIG. 16 is a diagram showing another form of a liquid crystal display device.

FIG. 16 is a diagram showing another embodiment of a liquid crystal display device.

A liquid crystal display unit (electro-optical apparatus) 901 shown in FIG. 16 includes a color liquid crystal panel (electro-optical panel) 902, and a circuit substrate 903 connected to the liquid crystal panel 902. In addition, lighting systems such as a back light, and other incidental equipment are attached to the liquid crystal panel 902 if necessary.

The liquid crystal panel 902 has a pair of substrates 905a and substrate 905b which are bonded with a sealant 904. In addition, a liquid crystal is enclosed in a gap formed between these substrates 905a and 905b, a so-called cell gap. Generally, these substrates 905a and 905b are formed of a translucent material, for example, glass, a synthetic resin, etc. A polarizing plate 906a and another polarizing plate are adhered on the outside surface of the substrates 905a and 905b. In FIG. 16, the illustration of another polarizing plate is omitted.

In addition, an electrode 907a is formed on the inner surface of the substrate 905a, and an electrode 907b is formed on the inner surface of the substrate 905b. These electrodes 907a and 907b are formed in a proper pattern state such as a stripe shape, characters, and numerals. In addition, these electrodes 907a and 907b are formed, for example, with a translucent material such as ITO (Indium Tin Oxide). The substrate 905a has an overhang section protruding ahead of the substrate 905b, and a plurality of terminals 908 is formed on this overhang section. These terminals 908 are formed concurrently with the electrode 907a when forming the electrode 907a on the substrate 905a. Therefore, these terminals 908 are formed, for example, of ITO. These terminals 908 include one extending from the electrode 907a integrally and another one connected to the electrode 907b via a conductive material (not shown).

A semiconductor device 900 as a liquid crystal driving IC is mounted in a predetermined position on a wiring board 909 in the circuit board 903. In addition, although illustration thereof is omitted, a resistor, a capacitor, and other chips may be mounted in predetermined positions of parts other than the part in which a semiconductor device 900 is mounted. The wiring board 909 is produced by forming a wiring pattern 912 by patterning metal films such as a Cu film formed on the base substrate 911 which is a flexible film such as a polyimide film.

In this embodiment, a wiring pattern 912 in the electrodes 907a and 907b, and a circuit board 903 in the liquid crystal panel 902, areformed by the above-mentioned device production method.

According to the liquid crystal display device of this embodiment, it is possible to achieve the miniaturization and thinning and to obtain the high-quality liquid crystal display device without defects such as a short circuit.

In addition, although the example mentioned above is a passive liquid crystal panel, an active matrix liquid crystal panel may be used. That is, thin-film transistors (TFTs) are formed on one substrate, and a pixel electrode is formed for each TFT. In addition, it is possible to form the wiring (gate wiring, source wiring) electrically connected to each TFT by using ink jet technology as mentioned above. On the other hand, opposing electrodes etc. are formed on an opposing substrate. The present invention is applicable also to such an active matrix liquid crystal panel.

(Seventh Embodiment)

A plasma display unit, which is as a seventh embodiment of the electro-optical apparatus of the present invention, is explained.

Figure 17:
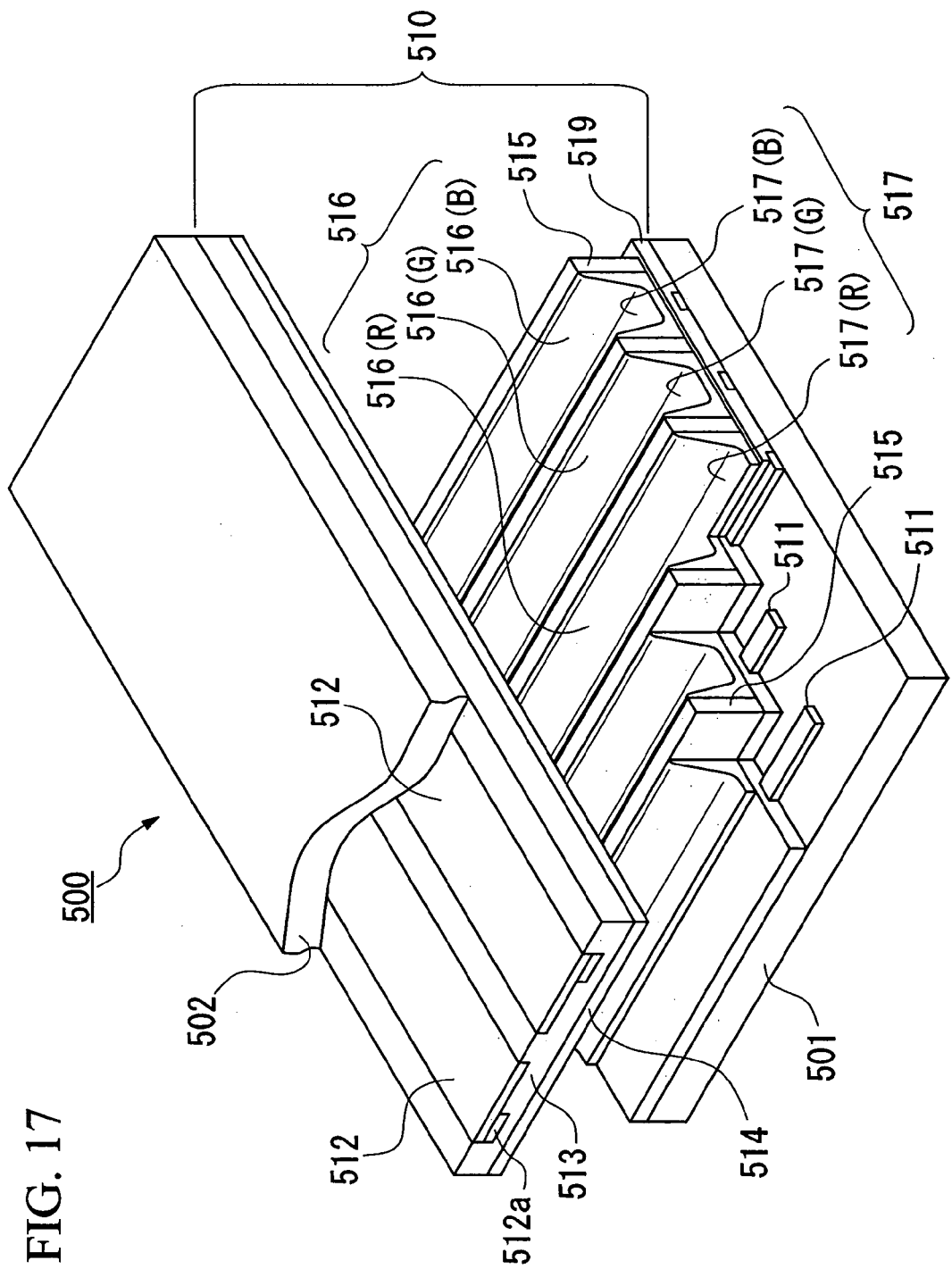
FIG. 17 is an exploded perspective view of a plasma display unit.

FIG. 17 shows an exploded perspective view of the plasma display unit 500 of this embodiment.

The plasma display unit 500 is constituted by including substrates 501 and 502 which are disposed with facing each other, and a discharge display section 510 formed between these.

The discharge display section 510 is an aggregate of a plurality of discharge chambers 516. This section 510 is disposed so that three discharge chambers of a red discharge chamber 516 (R), a green discharge chamber 516 (G), and a blue discharge chamber 516 (B) may form a group and may constitute one pixel among a plurality of discharge chambers 516.

Address electrodes 511 are formed on the top face of a substrate 501 in a stripe shape at predetermined intervals. Furthermore, a dielectric layer 519 is formed so as to cover top faces of the address electrodes 511 and substrate 501. On the dielectric layer 519, partitions 515 are formed so as to be disposed between the address electrodes 511 and 511 and to run along each address electrode 511. The partition 515 includes partitions adjacent to both the right and left sides of the address electrode 511 in the width direction, and partitions extended in the direction orthogonal to the address electrode 511. In addition, the discharge chambers 516 are formed corresponding to respective rectangular regions partitioned by the partitions 515.

In addition, a fluorescent substance 517 is disposed inside each rectangular region partitioned by the partitions 515. Each of the fluorescent substances 517 emits one of red, green, and blue fluorescence. The red fluorescent substance 517 (R), green fluorescent substance 517 (G), and blue fluorescent substance 517 (B) are disposed on bottoms of the red discharge chamber 516 (R), green discharge chamber 516 (G), and blue discharge chamber 516 (B), respectively.

On the other hand, a plurality of display electrodes 512 is formed at predetermined intervals in a stripe shape in the direction orthogonal to the above-mentioned address electrodes 511 on the substrate 502. A dielectric layer 513 and an overcoat 514 made of MgO, etc., are formed so as to cover these.

The substrates 501 and 502 are mutually adhered by facing each other so as to orthogonally intersect the above-mentioned address electrodes 511, ... and display electrodes 512, ... mutually.

The above-mentioned address electrodes 511 and display electrodes 512 are connected to an AC power supply, which is not shown. Since the fluorescent substances 517 perform excitation luminescence in the discharge display section 510 by turning on electricity to each electrode, color display becomes possible.

In this embodiment, since the above-mentioned address electrodes 511 and display electrodes 512 are formed on the basis of the above-mentioned method for forming a wiring pattern respectively, it is possible to achieve the miniaturization and thinning and to obtain the high-quality plasma display unit without defects such as a short circuit.

(Eighth Embodiment)

Figure 18:
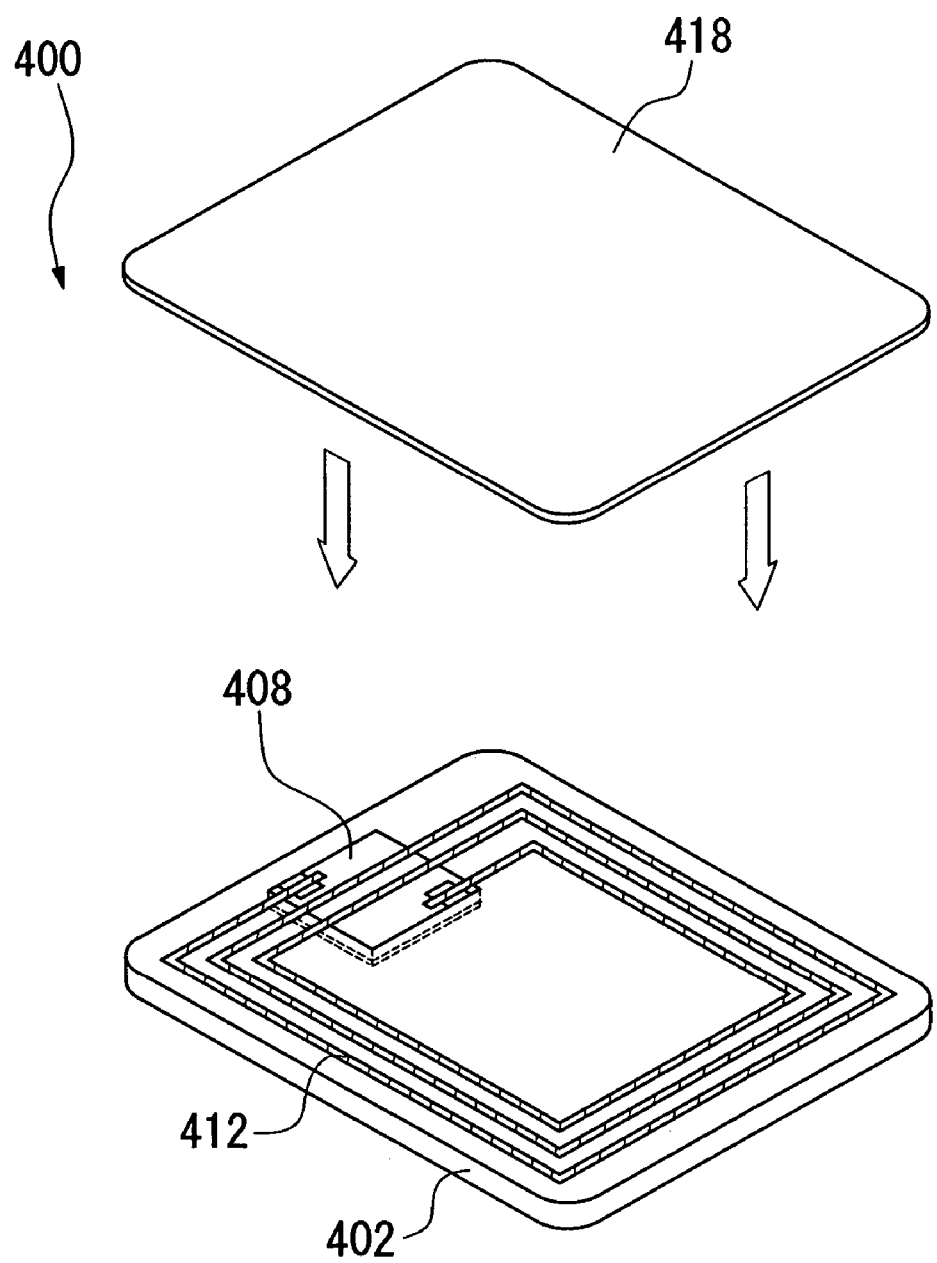
FIG. 18 is an exploded perspective view of a noncontact type card medium.

An embodiment of a noncontact type card medium will be explained as an eighth embodiment. As shown in FIG. 18, a noncontact type card medium (electronic apparatus) 400 according to this embodiment incorporates a semiconductor integrated circuit chip 408 and an antenna circuit 412 in a case comprising a card base 402 and a card cover 418. At least one of power supply and data transfer is executed by at least one of an electromagnetic wave and electrostatic capacitor coupling with an external transceiver.

In this embodiment, the above-mentioned antenna circuit 412 is formed by the method for forming a wiring pattern according to the above-mentioned embodiment.

According to the noncontact type card medium of this embodiment, it is possible to achieve the miniaturization and thinning and to obtain the high-quality noncontact type card medium without defects such as a short circuit.

In addition, the present invention is also applicable to a surface conduction type electron-emitting device, which uses a phenomenon in which electron emission occurs by flowing a current in parallel to a film surface in the thin film with a small area which is formed on the substrate, in addition to the above-described as a device (electro-optical apparatus) according to the present invention.

(Ninth Embodiment)

As a ninth embodiment, a specific example of the electronic apparatus of the present invention will be explained.

Figure 19A:
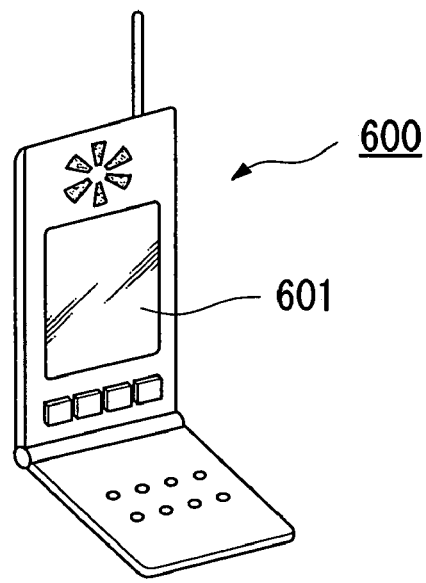
FIGS. 19A to 19C are diagrams showing examples of the electronic apparatus of the present invention.

FIG. 19A is a perspective view shown an example of a cellular phone. In FIG. 19A, reference numeral 600 denotes a portable telephone body and numeral 601 denotes a liquid crystal display section provided with the liquid crystal display unit of the above-mentioned embodiment.

Figure 19B:
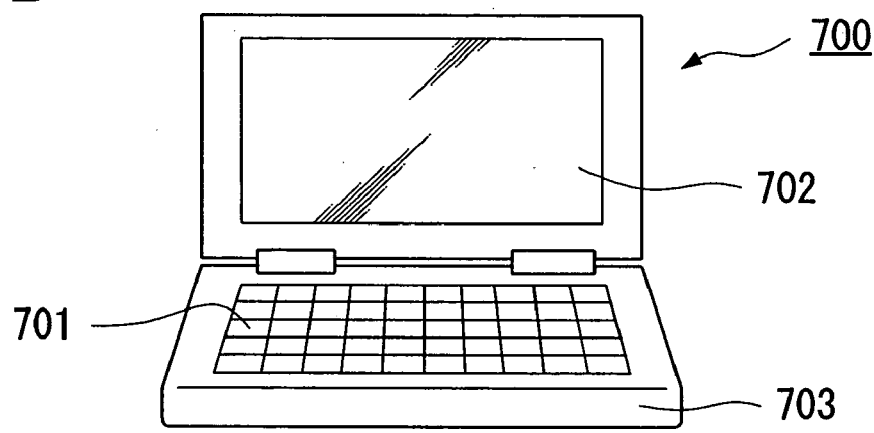

FIG. 19B is a perspective view showing an example of a portable information processing apparatus such as a word processor and a personal computer. In FIG. 19B, reference numeral 700 denotes an information processing unit, numeral 701 denotes an input section such as a keyboard, numeral 703 denotes an information processing unit main body, and numeral 702 denotes a liquid crystal display section provided with the liquid crystal display unit of the above-mentioned embodiment.

Figure 19C:
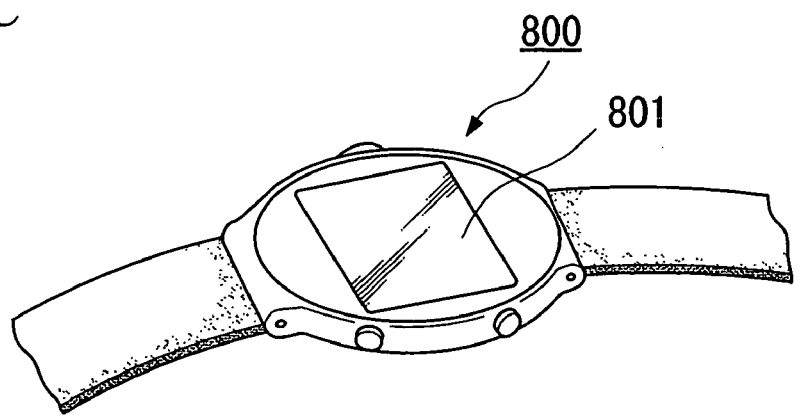

FIG. 19C is a perspective view showing an example of a wristwatch type electronic apparatus. In FIG. 19C, reference numeral 800 denotes a watch body and numeral 801 denotes a liquid crystal display section provided with the liquid crystal display unit of the above-mentioned embodiment.

Since each of the electronic apparatuses shown in FIGS. 19A to 19C includes the liquid crystal display unit of the above-mentioned embodiment, it is possible to achieve the miniaturization, thinning, and quality enhancement.

Although it is described that the electronic apparatus of this embodiment includes a liquid crystal apparatus, it is also possible to make it an electronic apparatus provided with another electro-optical apparatus such as an organic electroluminescent display unit or a plasma display unit.

As mentioned above, although the preferable examples of embodiments according to the present invention are explained with reference to the accompanying drawings, the present invention is not limited to such examples. Various shapes, combination, and the like of respective components shown in the examples mentioned above are merely examples, and hence, it is possible to modify embodiments variously on the basis of design demands and the like without departing from the spirit and sccopeof the present invention.

For example, although the above-mentioned embodiment is explained by using the example in which the width of the groove 31 is smaller than the diameter D of a liquid droplet, the present invention is not limited to this, but is also applicable to, for example, the case in which groove width and liquid droplet diameter are approximately similar, and the case in which groove width is larger than liquid droplet diameter. In addition, in the above-mentioned embodiment, in order to impart liquid-repellency to a bank, the plasma processing is performed, but as mentioned above, the structure in which a bank is formed with a material containing a fluorine or fluorine compound may be adopted. In addition, the structure of performing treatment other than the plasma processing may be adopted.

In addition, although the above-mentioned embodiment is explained by using the example in which the width of the application region H1 is smaller than the diameter of a liquid droplet, the present invention is not limited to this, but is also applicable to, for example, a case in which the width of the application region H1 and liquid droplet diameter are approximately similar, and a case in which the width of the application region H1 is larger than liquid droplet diameter.

In addition, although the above-mentioned embodiment is explained as a structure using a function liquid which consists of dispersion liquid where conductive fine particles are dispersed in a dispersion medium, the present invention is not limited to this, but it is also possible to use a material which exhibits electroconductivity, for example, by heating (heat treatment) or photo irradiation (light irradiation treatment) after pattern formation may be used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A production method for an active matrix substrate, comprising:

a first step of forming gate wiring on a substrate;

a second step of forming a gate insulating film on the gate wiring;

a third step of stacking a semiconductor layer on the gate insulating film;

a fourth step of forming a source electrode and a drain electrode on the gate insulating film;

a fifth step of disposing an insulating material on the source electrode and the drain electrode; and a sixth step of forming a pixel electrode on the disposed insulating material, wherein a method for forming a thin film pattern comprises ejecting a plurality of liquid droplets of a function liquid at predetermined pitches along a groove formed between banks, wherein each of the predetermined pitches is larger than a diameter of the liquid droplets and the predetermined pitches are set so that adjacent liquid droplets coalesce with each other when wetting and spreading within the groove, wherein the width of the groove is smaller than a diameter of the liquid droplets, and wherein liquid-repellency higher than that of the groove is imparted to the bank is used at at least one step of the first step, the fourth step, and the sixth step.

2. A production method for an active matrix substrate, comprising:

a first step of forming gate wiring on a substrate;

a second step of forming a gate insulating film on the gate wiring;

a third step of stacking a semiconductor layer on the gate insulating film;

a fourth step of forming a source electrode and a drain electrode on the gate insulating film;

a fifth step of disposing an insulating material on the source electrode and the drain electrode; and a sixth step of forming a pixel electrode on the disposed insulating material, wherein a method for forming a thin film pattern comprises ejecting a plurality of liquid droplets of a function liquid at predetermined pitches along an application region between liquid repellent areas formed with repellent films, wherein each of the predetermined pitches is larger than a diameter of the liquid droplets and the predetermined pitches are set so that adjacent liquid droplets coalesce with each other when wetting and spreading within the application region, wherein the width of the application region is smaller than a diameter of the liquid droplets, and wherein liquid-repellency higher than that of the application region is imparted to the liquid repellent area is used at at least one step of the first step, the fourth step, and the sixth step.

3. The method for producing an active matrix substrate according to claim 1, wherein the function liquid contains a material which exhibits electrical conductivity after heat treatment or light irradiation processing.

4. The method for producing an active matrix substrate according to claim 1, wherein the function liquid contains conductive fine particles.

5. The method for producing an active matrix substrate according to claim 2, wherein the repellent films are monomolecular film.

6. The method for producing an active matrix substrate according to claim 5, wherein the monomolecular films are self-organizing films made of organic molecules.

7. The method for producing an active matrix substrate according to claim 2, wherein the function liquid contains a material which exhibits electrical conductivity after heat treatment or light irradiation processing.

8. The method for producing an active matrix substrate according to claim 2, wherein the function liquid contains conductive fine particles.

* * * * *